(12) United States Patent
Jang et al.

(10) Patent No.: US 12,111,351 B2
(45) Date of Patent: Oct. 8, 2024

(54) TEST DEVICES, TEST SYSTEMS, AND OPERATING METHODS OF TEST SYSTEMS

(71) Applicant: Samsung Electronics Co., Ltd., Suwon-si (KR)

(72) Inventors: Ungjin Jang, Cheonan-si (KR); Seonggwon Jang, Asan-si (KR); Yongjeong Kim, Cheonan-si (KR); Sooyong Park, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 291 days.

(21) Appl. No.: 17/522,188

(22) Filed: Nov. 9, 2021

(65) Prior Publication Data

US 2022/0178997 A1    Jun. 9, 2022

(30) Foreign Application Priority Data

Dec. 4, 2020    (KR) .......................... 10-2020-0168723

(51) Int. Cl.
 *G11C 29/56* (2006.01)
 *G01R 31/317* (2006.01)
 (Continued)

(52) U.S. Cl.
CPC .  *G01R 31/31702* (2013.01); *G01R 31/31905* (2013.01); *G11C 29/08* (2013.01); *G11C 29/56* (2013.01); *G11C 2029/5602* (2013.01)

(58) Field of Classification Search
None
See application file for complete search history.

(56) References Cited

U.S. PATENT DOCUMENTS 9,001,925 B1 *  4/2015  Christensen ....... H04B 10/5162
                                                        375/295
9,699,009 B1     7/2017  Ainspan et al.
                (Continued)

FOREIGN PATENT DOCUMENTS

JP            6594470 B2    10/2019
KR     10-2009-0049290 A     5/2009
                (Continued)

OTHER PUBLICATIONS

English translation of WO 2006089483 A1 (Year: 2006).*

*Primary Examiner* — Jermele M Hollington
(74) *Attorney, Agent, or Firm* — HARNESS, DICKEY & PIERCE, P.L.C.

(57) ABSTRACT

A test device configured to test a device under test (DUT) performing an interface of a pulse amplitude modulation (PAM) operation includes a logic generation/determination device configured to generate multiple bits corresponding to a test pattern, first and second drivers configured to generate respective first and second non return to zero (NRZ) signals according to a logic state of respective first and second bits among the multiple bits and output the respective generated first and second NRZ signals via respective first and second channels. The first NRZ signal has a first high level or a first low level according to the logic state of the first bit, and the second NRZ signal has a second high level or a second low level according to the logic state of the second bit. The first and second high levels are different from each other.

19 Claims, 18 Drawing Sheets

(51) Int. Cl.
　　　*G01R 31/319*　　　(2006.01)
　　　*G11C 29/08*　　　(2006.01)

(56) References Cited

U.S. PATENT DOCUMENTS

| | | | |
|---|---|---|---|
| 10,110,402 | B2 | 10/2018 | Chen et al. |
| 10,142,089 | B2 | 11/2018 | Yao et al. |
| 10,312,896 | B2 | 6/2019 | Kim et al. |
| 10,403,337 | B2 | 9/2019 | Butterfiled |
| 10,425,260 | B2 | 9/2019 | Hollis et al. |
| 10,652,008 | B2 | 5/2020 | Pillai et al. |
| 10,989,758 | B2* | 4/2021 | Pandya ............ G01R 31/31716 |
| 11,336,501 | B2* | 5/2022 | Iwai ........................ H04L 27/32 |
| 2006/0193228 | A1* | 8/2006 | Bai ...................... H04B 10/508 |
| | | | 369/59.23 |
| 2009/0122904 | A1 | 5/2009 | Jang et al. |
| 2016/0087822 | A1* | 3/2016 | Kossel ................ H04L 25/4917 |
| | | | 375/286 |
| 2019/0102330 | A1 | 4/2019 | Hasbun et al. |
| 2019/0253044 | A1 | 8/2019 | Kim et al. |
| 2020/0119838 | A1* | 4/2020 | Brox .................... G11C 7/1057 |
| 2021/0273840 | A1* | 9/2021 | Iwai ..................... H04B 17/309 |

FOREIGN PATENT DOCUMENTS

| | | | | |
|---|---|---|---|---|
| KR | 10-2019-0016176 A | | 2/2019 | |
| KR | 10-2020-0008709 A | | 1/2020 | |
| KR | 10-2020-0015810 A | | 2/2020 | |
| WO | WO-2006089483 A1 * | | 8/2006 | ........... H04B 10/505 |
| WO | WO-2018087264 A1 * | | 5/2018 | |

\* cited by examiner

FIG. 8

| PAM4 | Case 1 | | Case 2 | |
|---|---|---|---|---|
| | CH1 | CH2 | CH1 | CH2 |
| 11 | 4/3*VDDQ | 2/3*VDDQ | 4/3*VDDQ | 2/3*VDDQ |
| 10 | 4/3*VDDQ | 0 | 2/3*VDDQ | 2/3*VDDQ |
| 01 | 0 | 2/3*VDDQ | 4/3*VDDQ | -2/3*VDDQ |
| 00 | 0 | 0 | 2/3*VDDQ | -2/3*VDDQ |

| PAM4 | Case 1 | | Case 2 | |
|---|---|---|---|---|
| | CH1 | CH2 | CH1 | CH2 |
| 11 | H | H | H | H |
| 10 | Hi-Z | H | Hi-Z | H |
| 01 | L | Hi-Z | Hi-Z | L |
| 00 | L | L | L | L |

| PAM4 | 1st Read | | 2nd Read | |
|---|---|---|---|---|
| | CH1 | CH2 | CH1 | CH2 |
| 11 | H | H | H | H |
| 10 | H | H | L | H |
| 01 | L | L | L | H |
| 00 | L | L | L | L |

| PAM8 | | CH1 | | CH2 | | CH3 | |
|---|---|---|---|---|---|---|---|
| 111 | VDDQ | 1 | 12/7*VDDQ | 1 | 6/7*VDDQ | 1 | 3/7*VDDQ |
| 110 | 6/7*VDDQ | 1 | 12/7*VDDQ | 1 | 6/7*VDDQ | 0 | 0 |
| 101 | 5/7*VDDQ | 1 | 12/7*VDDQ | 0 | 0 | 1 | 3/7*VDDQ |
| 100 | 4/7*VDDQ | 1 | 12/7*VDDQ | 0 | 0 | 0 | 0 |
| 011 | 3/7*VDDQ | 0 | 0 | 1 | 6/7*VDDQ | 1 | 3/7*VDDQ |
| 010 | 2/7*VDDQ | 0 | 0 | 1 | 6/7*VDDQ | 0 | 0 |
| 001 | 1/7*VDDQ | 0 | 0 | 0 | 0 | 1 | 3/7*VDDQ |
| 000 | 0 | 0 | 0 | 0 | 0 | 0 | 0 |

FIG. 15B

| Level (Logic) | 1st Read | 2nd Read | 3rd Read |
|---|---|---|---|
| VDDQ (111) | | | |
| 6/7*VDDQ (110) | 13/14*VDDQ ---- Vref1 | 13/14*VDDQ ---- Vref1 | 13/14*VDDQ |
| 5/7*VDDQ (101) | 11/14*VDDQ ---- Vref2 | 11/14*VDDQ ---- Vref2 | 11/14*VDDQ |
| 4/7*VDDQ (100) | 9/14*VDDQ ---- Vref3 | 9/14*VDDQ ---- Vref3 | 9/14*VDDQ |
| 3/7*VDDQ (011) | 7/14*VDDQ ---- Vref1/2/3 | 7/14*VDDQ | 7/14*VDDQ |
| 2/7*VDDQ (010) | 5/14*VDDQ | 5/14*VDDQ | 5/14*VDDQ ---- Vref1 |
| 1/7*VDDQ (001) | 3/14*VDDQ | 3/14*VDDQ | 3/14*VDDQ ---- Vref2 |
| 0 (000) | 1/14*VDDQ | 1/14*VDDQ | 1/14*VDDQ ---- Vref3 |

FIG. 15C

| PAM8 | 1st Read | | | 2nd Read | | | 3rd Read | | |
|---|---|---|---|---|---|---|---|---|---|
| | CH1 | CH2 | CH3 | CH1 | CH2 | CH3 | CH1 | CH2 | CH3 |
| 111 | H | H | H | H | H | H | H | H | H |
| 110 | H | H | H | L | H | H | H | H | H |
| 101 | H | H | H | L | L | H | H | H | H |
| 100 | H | H | H | L | L | L | H | H | H |
| 011 | L | L | L | L | L | L | H | H | H |
| 010 | L | L | L | L | L | L | L | H | H |
| 001 | L | L | L | L | L | L | L | L | H |
| 000 | L | L | L | L | L | L | L | L | L |

TEST DEVICES, TEST SYSTEMS, AND OPERATING METHODS OF TEST SYSTEMS

CROSS-REFERENCE TO RELATED APPLICATION

This application is based on and claims priority under 35 U.S.C. § 119 to Korean Patent Application No. 10-2020-0168723, filed on Dec. 4, 2020 in the Korean Intellectual Property Office, the disclosure of which is incorporated by reference herein in its entirety.

BACKGROUND

The inventive concepts relate to test devices, and more particularly, to test devices performing an interchangeability test between a non return to zero (NRZ) interface and a pulse amplitude modulation (PAM) interface, test systems, and operating methods of the test systems.

A memory device may receive a command, an address, and data from an external device. A new signaling method for improving an efficiency of an input/output interface of the memory device may be used, and a method of improving the efficiency of the input/output interface based on a signal including one of three or more voltage levels is proposed.

In a mass production process of the memory device, the memory device may be tested by a test device as a device under test (DUT).

SUMMARY

The inventive concepts provide operating methods of an interface based on an N-level pulse amplitude modulation (PAM) method, by utilizing a test device performing (e.g., including, supporting, etc.) an interface based on a 2-level pulse amplitude modulation (hereinafter, referred to as a non return to zero (NRZ)).

According to some example embodiments of the inventive concepts, a test device configured to test a device under test (DUT) performing an interface of a pulse amplitude modulation (PAM) operation may include: a logic generation/determination device configured to generate multiple bits corresponding to a test pattern; a first driver configured to generate a first non return to zero (NRZ) signal according to a logic state of a first bit among the multiple bits and output the generated first NRZ signal via a first channel; and a second driver configured to generate a second NRZ signal according to a logic state of a second bit among the multiple bits and output the generated second NRZ signal via a second channel, wherein the first NRZ signal has a first high level or a first low level according to the logic state of the first bit, and the second NRZ signal has a second high level or a second low level according to the logic state of the second bit, wherein the first high level is different from the second high level.

According to some example embodiments of the inventive concepts, a test system may include a test board configured to communicate with a test device that includes a non return to zero (NRZ) interface circuit, wherein the test board is configured to receive a first NRZ signal having a voltage level according to a logic state of a first bit among multiple bits from the test device via a first channel, and receive a second NRZ signal having a voltage level according to a logic state of a second bit among the multiple bits from the test device via a second channel. The test board may include a superposition line configured to provide a pulse amplitude modulation (PAM) signal, which is generated to satisfy a PAM operation by voltage-superposing the first NRZ signal and the second NRZ signal, as a test signal to a device under test (DUT).

According to some example embodiments of the inventive concepts, an operation method, of a test system configured to test a device under test (DUT) configured to perform an interface of a pulse amplitude modulation (PAM) operation, may include: outputting a first non return to zero (NRZ) signal according to a logic state of a first bit among multiple bits corresponding to a test pattern via a first channel; outputting a second NRZ signal according to a logic state of a second bit among the multiple bits via a second channel; and providing a PAM signal generated to satisfy the PAM operation based on voltage-superposing the first NRZ signal and the second NRZ signal as a test signal to the DUT, wherein the first NRZ signal has a first high level or a first low level according to the logic state of the first bit, and the second NRZ signal has a second high level or a second low level according to the logic state of the second bit, wherein the first high level is different from the second high level.

BRIEF DESCRIPTION OF THE DRAWINGS

Example embodiments of the inventive concepts will be more clearly understood from the following detailed description taken in conjunction with the accompanying drawings in which:

FIG. 8 is a table illustrating examples of voltage levels of signals output by a test device, according to some example embodiments;

FIGS. 14A, 14B, 15A, 15B, and 15C are drawings of operation examples of a test system, according to some example embodiments.

DETAILED DESCRIPTION

Hereinafter, example embodiments of the inventive concepts are described in detail with reference to the accompanying drawings.

It will be understood that, as described herein, a "level" of a signal, voltage, or the like may be interchangeably referred to as a magnitude of the signal, voltage, or the like.

As described herein, when an operation is described to be performed "by" performing additional operations, it will be understood that the operation may be performed "based on" the additional operations, which may include performing said additional operations alone or in combination with other further additional operations.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1A:
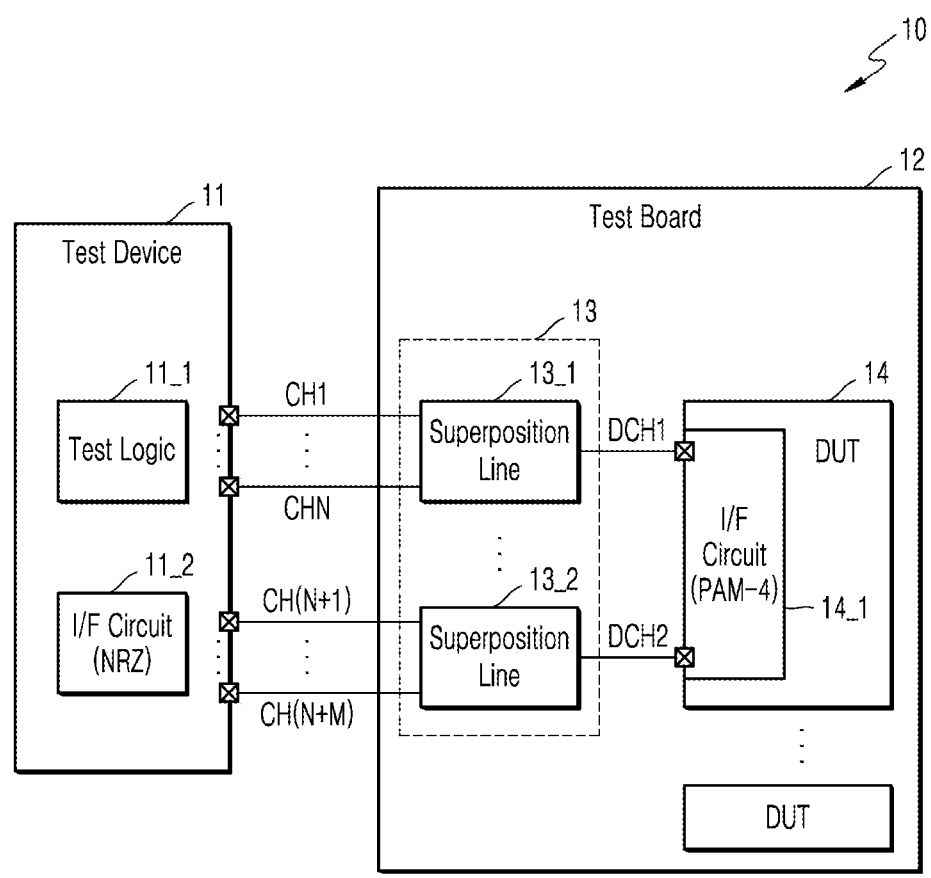
FIGS. 1A and 1B are block diagrams illustrating a test system according to some example embodiments.
Figure 1B:
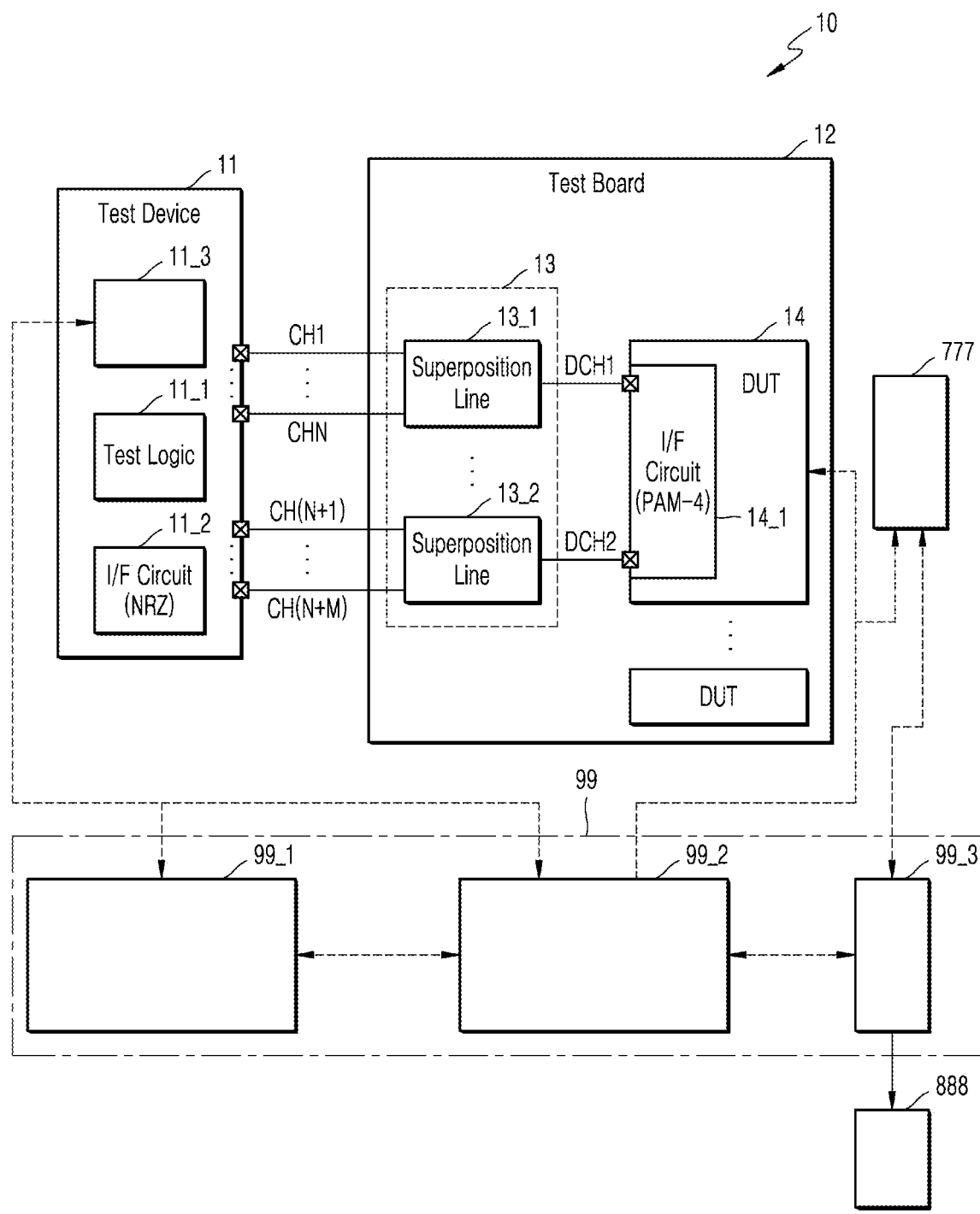

FIGS. 1A and 1B are block diagrams illustrating a test system 10 according to some example embodiments.

Referring to FIGS. 1A and 1B, the test system 10 for testing various types of semiconductor devices such as a memory device may include, together with a test device 11, a test board 12, on which one or more device under tests (DUTs) 14 for performing tests are mounted. In addition, various components may be mounted on the test board 12 in relation to a test operation, and the test board 12 may be equipped with the test device 11 and the DUT 14 together, but example embodiments are not limited thereto. For example, the test device 11 may communicate with the DUT 14 via the test board 12, as the test device 11 is arranged outside the test board 12. In some example embodiments, the DUT 14 may communicate with the test device 11 via the test board 12, as the DUT 14 is arranged outside the test board 12.

The test board 12 may be referred to as an interface board from an aspect of providing an interface between the test device 11 and the DUT 14. For example, the test board 12 may include a printed circuit board (PCB), and the PCB may include multiple conductive lines for transmitting electrical signals, and the test signals from the test device 11 may be transmitted to the DUT 14 via the multiple conductive lines, or test results from the DUT 14 may be transmitted to the test device 11 via the multiple conductive lines. In some example embodiments, at least a portion of the multiple conductive lines may be related to signaling between the test device 11 and the DUT 14, and a configuration including the at least a portion of the multiple conductive lines may be referred to as a wiring circuit (or, a wiring circuit region 13).

The test device 11 may include a test logic 11_1 and an I/F circuit (NRZ) 11_2. Although not illustrated in FIGS. 1A and 1B, the test device 11 may further include various components such as a communication device that communicates with an external host requesting a test, a memory that temporarily stores various pieces of information related to various tests, and a power supply circuit providing power to the DUT 14. In addition, the test system 10 according to some example embodiments may be variously defined, and as an example, may be defined as that configuration components except for the DUT 14 in FIGS. 1A and 1B constitute the test system 10.

According to some example embodiments, the test device 11 may include a semiconductor chip such as a field programmable gate array (FPGA), an application specific integrated circuit (ASIC), and an application processor (AP), and as illustrated in FIGS. 1A and 1B, test operations on multiple DUTs 14 may be performed in parallel as the multiple DUTs 14 are mounted on the test board 12. In addition, the test device 11 may provide test signals to the DUT 14 via multiple channels in parallel when performing a test on one DUT 14, and may receive test results in parallel with each other via the multiple channels from one DUT 14.

A test process of determining whether the semiconductor device is defective may be performed at various stages in a semiconductor process, and may include, for example, a wafer level test and a test after the wafer level test. The wafer level test may correspond to a test on an individual semiconductor die at a wafer level. In addition, a test after the wafer level test may be a test on a semiconductor die before packaging is performed, or a test on a semiconductor package in which one semiconductor die (or semiconductor chip) has been packaged. In some example embodiments, the test on the semiconductor package may be a test on the semiconductor package including a plurality of semiconductor chips.

In some example embodiments, the DUT 14 may include semiconductor devices of various types, and as an example, may include a memory device including a semiconductor memory cell array. For example, the memory device may include dynamic random access memory (RAM) (DRAM) such as double data rate (DDR) synchronous DRAM (SDRAM), low power DDR (LPDDR) SDRAM, graphics DDR (GDDR) SDRAM, and rambus DRAM (RDRAM). In some example embodiments, the memory device may include a non-volatile memory such as a flash memory, magnetic RAM (MRAM), ferroelectric RAM (FeRAM), phase change RAM (PRAM), and resistive RAM (ReRAM).

The DUT 14 may include an interface (I/F) circuit 14_1, receive test signals from the test device 11, and store data according to the received test signals in a memory cell array (not illustrated). In addition, the DUT 14 may read data stored in the memory cell array, and provide test results according to the read data to the test device 11 via the I/F circuit (PAM) 14_1.

According to some example embodiments, the DUT 14 may include a memory device that interfaces with a modulated signal based on an N-level pulse amplitude modulation (hereinafter, referred to as PAM-N, where N is a natural number equal to or greater than 3) method. As referred to herein, a PAM-N method performed by a DUT, including DUT 14, may be referred to interchangeably as a PAM-N operation. For example, the I/F circuit (PAM) 14_1 of the DUT 14 may perform interfacing by using one of PAM-4, PAM-6, PAM-8, or PAM-16 methods. The PAM-N method may be a modulation method for transmitting a plurality of bits in one unit interval. In some example embodiments, the unit interval may correspond to a symbol period for transmitting a signal of one symbol. For example, when data is modulated by the PAM-N method, one symbol may include the plurality of bits. Hereinafter, example embodiments will be described based on the PAM-4 method in which each symbol includes 2 bits among various PAM-N methods, and for convenience of description, PAM-4, PAM-6, PAM-8, and PAM-16 signals will be referred to as PAM signals in a generic term. Accordingly, it will be understood that the test device 11 may be configured to test a DUT 14 that is performing (and/or is configured to perform) an interface of a pulse amplitude modulation (PAM) operation.

In some example embodiments, the test device 11 may include the I/F circuit (NRZ) 11_2 that interfaces with a signal that is modulated based on a 2-level PAM (hereinafter, referred to as the NRZ) method. The NRZ method may be a modulation method for transmitting one bit during one unit interval, and when a signal is modulated by the NRZ method, one symbol may include one bit.

According to some example embodiments, a test on the DUT 14 employing a PAM-4 interface by utilizing the test device 11 that does not support the PAM-4 interface may be performed. In other words, a test on the DUT 14 based on the PAM-4 method may be performed by using the test device 11 based on the NRZ interface, without a need to replace expensive main components for the PAM-4 modulation method.

According to some example embodiments, the test board 12 may include a superposition line that voltage-superposes 2-level voltage signals (hereinafter, referred to as NRZ signals) transmitted as test signals from the test device 11 via two or more channels. For example, as the test device 11 transmits a test signal via multiple channels, the wiring circuit region 13 may include one or more superposition lines (for example, first and second superposition lines 13_1 and 13_2), and each of the first and second superposition lines 13_1 and 13_2 may provide a PAM signal having a voltage level satisfying a level based on the PAM-4 interface to the DUT 14, by voltage-superposing at least two NRZ signals. For example, a voltage level of the PAM signal may have any of four levels corresponding to logic states, that is, '00', '01', '10', and/or '11'. For example, the test board 12 may be configured to receive a first NRZ signal having a voltage level according to a logic state of a first bit among multiple bits from the test device 11 via a first channel CH1, and receive a second NRZ signal having a voltage level according to a logic state of a second bit among the multiple bits from the test device 11 via a second channel CH2, and the test board 12 may include a superposition line (e.g., first superposition line 13_1) configured to provide a pulse amplitude modulation (PAM) signal, which is generated to satisfy a PAM operation based on voltage-superposing the first NRZ signal and the second NRZ signal, as a test signal to the device under test (DUT) 14.

According to some example embodiments, each of the first and second superposition lines 13_1 and 13_2 may receive the NRZ signals via multiple channels. In some example embodiments, including the example embodiments of FIGS. 1A and 1B, an example is illustrated in which the first superposition line 13_1 may receive the NRZ signals via first through $N^{th}$ channels CH1 through CHN (N being any natural number greater than 1, for example any natural number equal to or greater than 3), and the second superposition line 13_2 may receive the NRZ signals via $(N+1)^{th}$ through $(N+M)^{th}$ channels CH(N+1) through CH(N+M) (M being any natural number greater than 1, for example any natural number equal to or greater than 3). The first superposition line 13_1 may voltage-superpose N of NRZ signals to establish a PAM signal that is a test signal having a voltage level satisfying a PAM-N method, and may provide the PAM signal to the DUT 14 via any one DUT channel (for example, a first DUT channel DCH1). In addition, the second superposition line 13_2 may voltage-superpose M of NRZ signals to establish a PAM signal that is a test signal having a voltage level satisfying a PAM-N method, and may provide the PAM signal to the DUT 14 via the other DUT channel (for example, a second DUT channel DCH2).

As an example of a test operation, the test logic 11_1 may generate data of multiple bits as a test pattern, and each bit may have a logic state according to a value thereof. The I/F circuit (NRZ) 11_2 may generate and output the NRZ signals based on the logic state of multiple bits, the NRZ signals may be converted to the PAM signal via the first and second superposition lines 13_1 and 13_2, and the PAM signal may be provided to the DUT 14. As an example of the PAM-4 method, one PAM signal provided to the DUT 14 may include 2 bits, the logic state of the 2 bits may be determined by a demodulation process on the PAM signal in the DUT 14, and data of 2 bits determined from each PAM signal may be stored in the memory cell array in the DUT 14.

However, the test result from the DUT 14 may be provided to the test device 11 via the wiring circuit region 13. For example, as the DUT 14 generates the PAM signal based on the PAM-4 method, the PAM signal transmitted via a channel of each DUT 14 may include data of 2 bits. In addition, the PAM signal may be provided to at least two channels in common (or in parallel) via the wiring circuit region 13, and may be provided to the I/F circuit (NRZ) 11_2 of the test device 11. The test device 11 may determine a logic state based on the NRZ interface for the received PAM signal, and as an example, may perform the determination operation on multiple channels to which the same PAM signal has been transmitted based on different criteria from each other. For example, the same PAM signal may be received via the first through $N^{th}$ channels CH1 through CHN, a determination operation on the PAM signal may be performed in response to each of the first through $N^{th}$ channels CH1 through CHN, and because different discrimination criteria are applied to the first through $N^{th}$ channels CH1 through CHN, the determination result may be different in at least two channels of the first through $N^{th}$ channels CH1 through CHN. In other words, a logic state of 2-bit data of the PAM signal may be determined based on a combination of the result determined in the first through $N^{th}$ channels CH1 through CHN.

According to the example embodiments described above, the DUT 14 based on the PAM interface may be tested by using a test device 11 based on the existing NRZ interface (e.g., a test device having NRZ I/F circuitry and not PAM I/F circuitry) without using a separate device such as an ASIC and an FPGA for interface conversion between the NRZ and the PAM interfaces of the respective test device 11 and the DUT 14. Accordingly, there may be no need to include a separate test device supporting the PAM interface (e.g., a test device that specifically includes PAM I/F circuitry), and a PAM interface-based DUT may be tested without cost due to an addition of separate expensive components for conversion between different interfaces.

For example, a test device 11 having NRZ interface circuitry (e.g., I/F Circuit (NRZ) 11_2) and not including PAM interface circuitry may be configured to test a DUT 14 that has PAM interface circuitry (e.g., I/F Circuit (PAM-4) 14_1) based on at least including and/or implementing the aforementioned logic generation/determination device configured to generate multiple bits corresponding to a test pattern, the aforementioned first driver configured to generate a first non return to zero (NRZ) signal according to a logic state of a first bit among the multiple bits and output the generated first NRZ signal via a first channel, and the aforementioned second driver configured to generate a second NRZ signal according to a logic state of a second bit among the multiple bits and output the generated second NRZ signal via a second channel, wherein the first NRZ signal has a first high level or a first low level according to the logic state of the first bit, and the second NRZ signal has a second high level or a second low level according to the logic state of the second bit, and wherein the first high level is different from the second high level.

As a result of providing such a test device configured to test a device under test (DUT) performing an interface of a pulse amplitude modulation (PAM) operation, costs associated with developing the test device, including fabrication cost of the test device, costs associated replacing main components related to signal generation in an existing test device, or the like may be reduced, thereby improving the practicality and cost-effectiveness of both the test device and the manufacture of the device under test (based on reducing the costs associated with testing such devices during manufacture thereof). Additionally, costs associated with manufacturing memory devices and/or electronic devices 888 as described herein based on providing such a test device, based for example on the reduced costs associated with the testing provided by the test device in association with the manufacturing of memory devices and/or electronic devices 888.

In some example embodiments, the configuration of a test device 11 having NRZ interface circuitry (e.g., I/F Circuit (NRZ) 11_2) and not including PAM interface circuitry to test a DUT 14 that has PAM interface circuitry (e.g., I/F Circuit (PAM-4) 14_1), and thus reducing the aforementioned costs associated with the test device, the DUT, manufactured memory devices and/or manufactured electronic devices may be further based on the first NRZ signal and the second NRZ signal being voltage-superposed via a superposition line formed on a test board 12, and provided as a test signal to the DUT 14.

In some example embodiments, the configuration of the test board 12 to receive a first NRZ signal having a voltage level according to a logic state of a first bit among multiple bits from the test device 11 via a first channel CH1, and receive a second NRZ signal having a voltage level according to a logic state of a second bit among the multiple bits from the test device 11 via a second channel CH2, and the further inclusion in the test board 12 of a superposition line (e.g., first superposition line 13_1) configured to provide a pulse amplitude modulation (PAM) signal, which is generated to satisfy a PAM operation based on voltage-superposing the first NRZ signal and the second NRZ signal, as a test signal to the device under test (DUT) 14, may further enable a test device 11 having NRZ interface circuitry (e.g., I/F Circuit (NRZ) 11_2) and not including PAM interface circuitry may be configured to test a DUT 14 that has PAM interface circuitry (e.g., I/F Circuit (PAM-4) 14_1) and which may not include NRZ interface circuitry, thereby reducing the aforementioned costs associated with the test device, the DUT, manufactured memory devices and/or manufactured electronic devices.

Still referring to FIGS. 1A and 1B, in some example embodiments, the test device 11 may be configured to determine a logic state and/or voltage level of a test result based on a signal (e.g., a PAM signal) received from the DUT 14 as described herein, which may be received subsequently to and/or in response to the test device 11 and/or test board 12 providing the PAM signal to the DUT 14 based on the first and second NRZ signals (e.g., the voltage-superposing of same to generate and/or provide the PAM signal). Based on determining the logic state and/or voltage level of the test result, the test device 11 and/or the test board 12 may determine whether the DUT passes or fails a test. As shown in FIG. 1B, the test system 10 (e.g., the test device 11 and/or the test board 12) may include a communication interface 11_3, for example a wired or wireless communication interface or transceiver. The test device 11 and/or the test board 12 may generate a pass/fail signal based on determining whether the DUT passes or fails the test (which may be determined based on determining the logic state of the test result. For example, based on determining that the logic state of a test result is '11', the DUT may be determined to have passed the test. In another example, based on determining that the logic state of a test result is '00', the DUT may be determined to have failed the test. The test device 11 and/or the test board 12 may be configured to generate a pass/fail signal that indicates whether the DUT passed or failed the test and may transmit the pass/fail signal to an external device via the interface 11_3. In some example embodiments, the interface 11_3 may be included in a circuit of the test device 11, for example a test control circuit of the test device according to some example embodiments.

Referring to FIG. 1B, the test system 10 may be communicatively coupled to a manufacturing system 99 that is configured to manufacture (e.g., mass produce) electronic devices 888 based on one or more input memory devices associated with the DUT 14, such devices including the DUT 14 and/or memory devices 777 that may be associated with the DUT 14 (e.g., the DUT 14 may be selected from a batch of memory devices that includes the memory devices 777 in order to serve as a representative of the memory devices 777 for testing by the test system 10). Electronic devices 888 may be memory devices such as the device under test DUT 14 and/or memory devices 777 associated with the DUT 14, and/or may be electronic devices that incorporate memory devices such as the device under test DUT 14 and/or memory devices 777 associated with the DUT 14 as components thereof. The manufacturing system 99 may include a control device 99_1, an actuator device 99_2, a manufacturing device 99_3 (which may be one or more manufacturing devices) that is configured to manufacture the electronic devices 888 based on using one or more memory devices as an input. The actuator device 99_2 may be a motorized manipulator, arm, deflector arm, gate, or the like which is configured to selectively manipulate, direct, and/or divert one or more memory devices to/from the manufacturing device 99_3, to an input area the manufacturing device 99_3 or discard area (e.g., diverted from the manufacturing process) to be excluded from being included in the manufactured electronic devices 888.

In some example embodiments, where the manufactured electronic devices 888 are the memory devices 777 and/or DUT 14, the manufacturing device 99_3 and the actuator device 99_2 may be the same device, and the manufacturing of the electronic devices 888 may include selectively directing/forwarding certain memory devices (e.g., 777 and/or 14) to a finished product area or diverting/discarding certain memory devices (e.g., 777 and/or 14) to a separate (e.g., discard) area. In some example embodiments, where the manufactured electronic devices 888 incorporate the memory devices 777 and/or DUT 14 as components thereof, the manufacturing device 99_3 and the actuator device 99_2 may be different devices, and the manufacturing device 99_3 may operate to assemble an electronic device 888 that incorporates one or more memory devices associated with the DUT 14 (e.g., devices 14 and/or 777) as one or more components thereof. In some example embodiments, the actuator device 99_2 may be a part of the manufacturing device 99_3, such that commands transmitted to control the actuator device 99_2 may be transmitted to the manufacturing device 99_3.

Still referring to FIG. 1B, in some example embodiments, the aforementioned pass/fail signal generated at the test system 10, indicating whether the DUT 14 has passed or failed a test, may be received at the control device 99_1. The control device 99_1 may, in response to processing the pass/fail signal, selectively include or exclude one or more memory devices from being included in the memory devices that are input to the manufacturing device 99_3 to manufacture one or more electronic devices 888.

In some example embodiments, the control device 99_1 may command the actuator device 99_2 and/or the manufacturing device 99_3 to selectively include the DUT 14 itself as an input to the manufacturing device 99_3 to be included in a manufactured electronic device 888 or to exclude (e.g., divert, discard, etc.) the DUT 14 from being input to the manufacturing device 99_3 and thus excluded from the manufactured electronic devices 888.

In some example embodiments, the DUT 14 may be selected from memory devices 777 (which may be a particular batch of manufactured memory devices) and may be tested at test system 10 as a representative of the memory devices 777. Accordingly, it will be understood that the memory devices 777 may be associated with the DUT 14 (e.g., based on the DUT 14 being selected from a batch of memory devices that also includes the memory devices 777). The control device 99_1 may command the actuator device 99_2 and/or the manufacturing device 99_3 to selectively include or exclude the particular memory devices 777 (which may or may not further include DUT 14) as an input to the manufacturing device 99_3 to be included in, or excluded from being included in, the manufactured electronic devices 888 in response to the DUT 14 being determined to pass or fail the test, respectively.

Accordingly, the control device 99_1 may cause the manufacturing system 99 to manufacture one or more electronic devices 888 such that one or more particular memory devices associated with the DUT 14 (which may include memory devices 777 and may or may not include the DUT 14) are selectively included in or excluded from the one or more manufactured electronic devices 888, based on a determined logic state and/or voltage level of the test result received (e.g., at the test device 11) from the DUT 14.

As shown in FIG. 1A, the test system 10 may or may not be communicatively coupled to a manufacturing system 99 that is configured to manufacture (e.g., mass produce) electronic devices 888 based on one or more input memory devices associated with the DUT 14, such devices including the DUT 14 and/or memory devices 777 that may be associated with the DUT 14. In some example embodiments, the aforementioned pass/fail signal generated at the test system 10, indicating whether the DUT 14 has passed or failed a test, may be used to selectively distribute one or more memory devices (e.g., in response to a pass signal), selectively re-direct one or more memory devices to be repaired (e.g., in response to a fail signal), selectively re-direct one or more memory devices to be disposed/discarded (e.g., in response to a fail signal), or the like. The one or more memory devices may be distributed as finished products and/or as components of other products. The one or more memory devices may include the DUT 14 and/or memory devices that may be associated with the DUT 14 (e.g., the memory devices 777 shown in FIG. 1B). The selective distribution and/or re-direction may be controlled by a control device, which may be implemented by one or more instances of processing circuitry as described herein and may be communicatively coupled to at least the test system such that the control device is configured to receive and process pass/fail signals generated at the test system 10. Such a control device may be internal or external to one or more devices of the test system 10.

Figure 2:
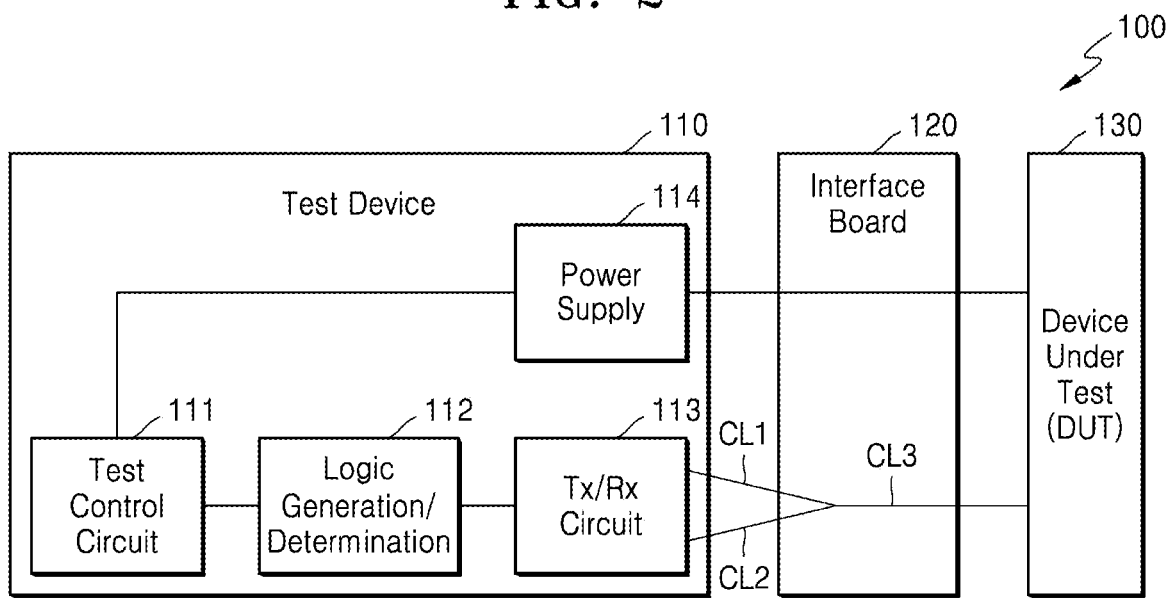
FIGS. 2 and 3 are block diagrams of a test system illustrating an implementation example of a test device.
Figure 3:
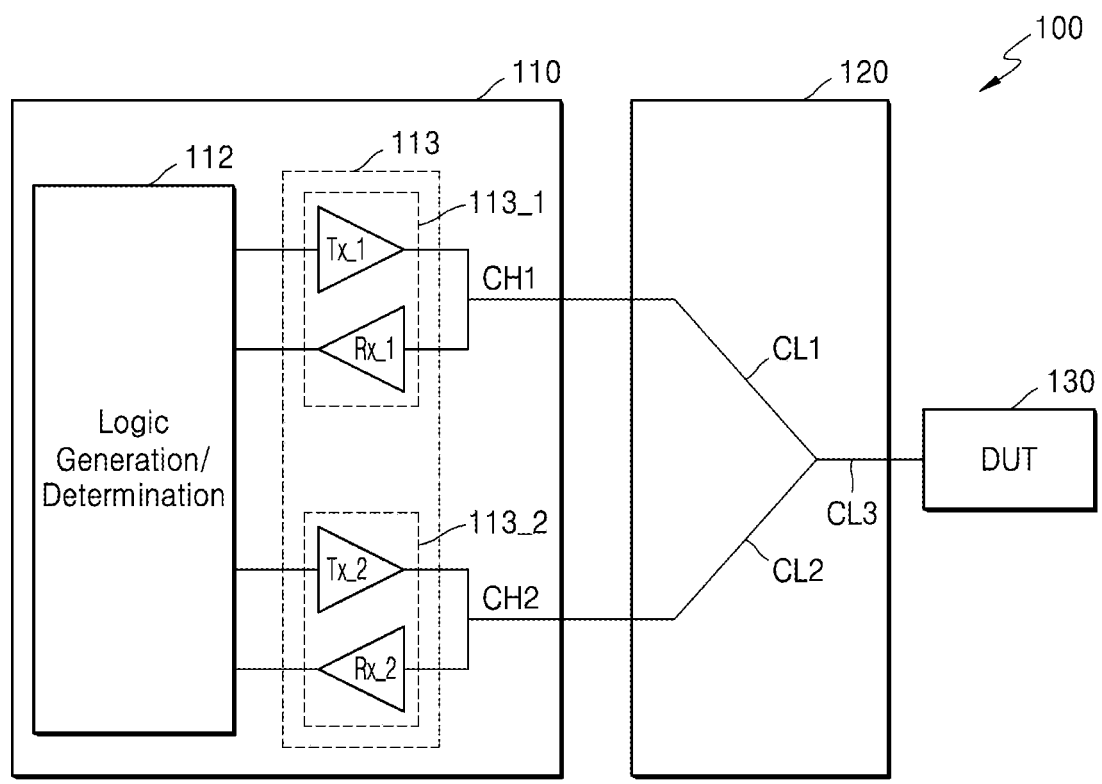

FIGS. 2 and 3 are block diagrams of a test system 100 illustrating an implementation example of a test device 110. In FIGS. 2 and 3, a DUT 130 may be mounted within an interface board 120 (or a test board), but for convenience of explanation, the DUT 130 is illustrated outside the interface board 120.

Referring to FIG. 2, the test system 100 may include the test device 110 and the interface board 120, and the DUT 130 may be mounted on the test system 100 to perform a test. The test device 110 may be configured to test a DUT 130 that is performing (and/or is configured to perform) an interface of a pulse amplitude modulation (PAM) operation. The test device 110 may include a test control circuit 111, a logic generation/determination device 112, a transmit (Tx)/receive (Rx) circuit 113, and a power supply 114, and the interface board 120 may include the superposition line according to the above-described example embodiments. In FIG. 2, the superposition line may be simply illustrated as an electrical wiring for convenience of illustration. In addition, the Tx/Rx circuit 113 may be referred to as a pin electrical circuit from an aspect of controlling an electrical signal by using pins (not illustrated) of the test device 110 connected to the multiple channels.

At least a portion of the components of the test device 110 illustrated in FIG. 2 may be provided to and/or implemented by the test logic 11_1 illustrated in FIGS. 1A and 1B. For example, at least a portion of the components of the test device 110 illustrated in FIG. 2 may constitute the test control circuit 111 and the logic generation/determination device 112 may be provided in (e.g., included and/or implemented by) the test logic 11_1. In addition, the Tx/Rx circuit 113 may be a component included in the I/F circuit 14_1 in the above-described example embodiments. The test control circuit 111 may control all operations of the test device 110, and the logic generation/determination device 112 may generate data having a logic state corresponding to the test pattern. For example, the logic generation/determination device 112 may be configured to generate multiple bits corresponding to a test pattern. In addition, the logic generation/determination device 112 may perform a logic determination operation on test results received via the Tx/Rx circuit 113, and based on this performance, may determine logic states of the bits included in the test results.

The Tx/Rx circuit 113 may include a circuit (for example, a driver) converting and outputting data having a value of logic 0 or logic 1 to a physically electrical signal applied to the DUT 130 (for example, a logic high voltage and a logic low voltage), and a circuit (for example, a comparator) comparing a level of the physical electrical signal to at least one reference voltage for determining the logic state of the electrical signal provided by the DUT 130. As an example, the test device 110 may include multiple pins transceiving the test signal and test results via multiple channels, and the Tx/Rx circuit 113 may include one or more drivers and one or more comparators in correspondence to each pin.

For example, test signals transmitted from the test device 110 via two channels (for example, a first channel CH1 and a second channel CH2) may be voltage-superposed by passing through the interface board 120 (e.g., may be voltage superposed via a superposition line formed on the interface board 120) and provided as a test signal to the DUT 130, and the superposition line of the interface board 120 may include a first conductive line CL 1 connected to the first channel CH1, a second conductive line CL 2 connected to the second channel CH2, and a third conductive line CL 3 electrically commonly connected to (e.g., electrically connected to both of) the first and second conductive lines CL 1 and CL 2. The first conductive line CL 1 and the second conductive line CL 2 may be referred to as dual-transmission lines respectively transmitting separate signals, and to secure high-speed transmission characteristics of the test signal, the first conductive line CL 1 and the second conductive line CL 2 may be arranged with the same or substantially the same length.

However, the third conductive line CL 3 may be provided via any one channel of the DUT 130, and the test signal transmitted via the third conductive line CL 3 may have a voltage level satisfying the PAM-4 method as in the above-described example embodiments. The third conductive line CL 3 may be configured to transmit the PAM signal that is generated based on voltage-superposing the first NRZ signal and the second NRZ signal that are received via the first and second channels CH1 and CH2, respectively. The third conductive line CL 3 may be connected to the DUT 130 via a DUT channel (for example, a first DUT channel DCH1) and may provide the PAM signal to the DUT 130 via the DUT channel. In addition, the power supply 114 may provide power to be used for the test operation to the DUT 130, and as an example, the power may be provided to the DUT 130 via the interface board 120.

In some example embodiments, and as shown in FIG. 3, a transmit (Tx)/receive (Rx) circuit 113 may include a first driver Tx_1 and a first comparator Rx_1 (collectively a first Tx/Rx circuit 113_1) connected to the first channel CH1 and a second driver Tx_2 and a second comparator Rx_2 (collectively a second Tx/Rx circuit 113_2) connected to the second channel CH2. According to a bit value of data from the logic generation/determination device 112, the first driver Tx_1 may output a first signal having any one level of two voltage levels corresponding to one bit (for example, a first bit). In addition, the second driver Tx_2 may output a second signal having any one level of two voltage levels corresponding to a second bit. In addition, according to some example embodiments, the voltage level of the first signal output by the first driver Tx_1 may be different from the voltage level of the second signal output by the second driver Tx_2 so that a superposition signal satisfies the PAM method. For example, the first driver Tx_1 may generate a first non return to zero (NRZ) signal according to a logic state of a first bit among the multiple bits and output the generated first NRZ signal via the first channel CH1 and the second driver Tx_2 may generate a second NRZ signal according to a logic state of a second bit among the multiple bits and output the generated second NRZ signal via a second channel CH2.

In addition, a third signal provided as the test result after being generated according the PAM method may be transmitted to the first conductive line CL 1 and the second conductive line CL 2 via a third conductive line CL 3, and the third signal may be provided commonly to the first channel CH1 and the second channel CH2 via the first conductive line CL 1 and the second conductive line CL 2, respectively. Each of the first comparator Rx_1 and the second comparator Rx_2 may perform the determination operation on the third signal that is common, based on different conditions. The logic state of the data of 2 bits from the third signal from the DUT 130 may be determined by combining the first comparator Rx_1 with the second comparator Rx_2.

Figure 4:
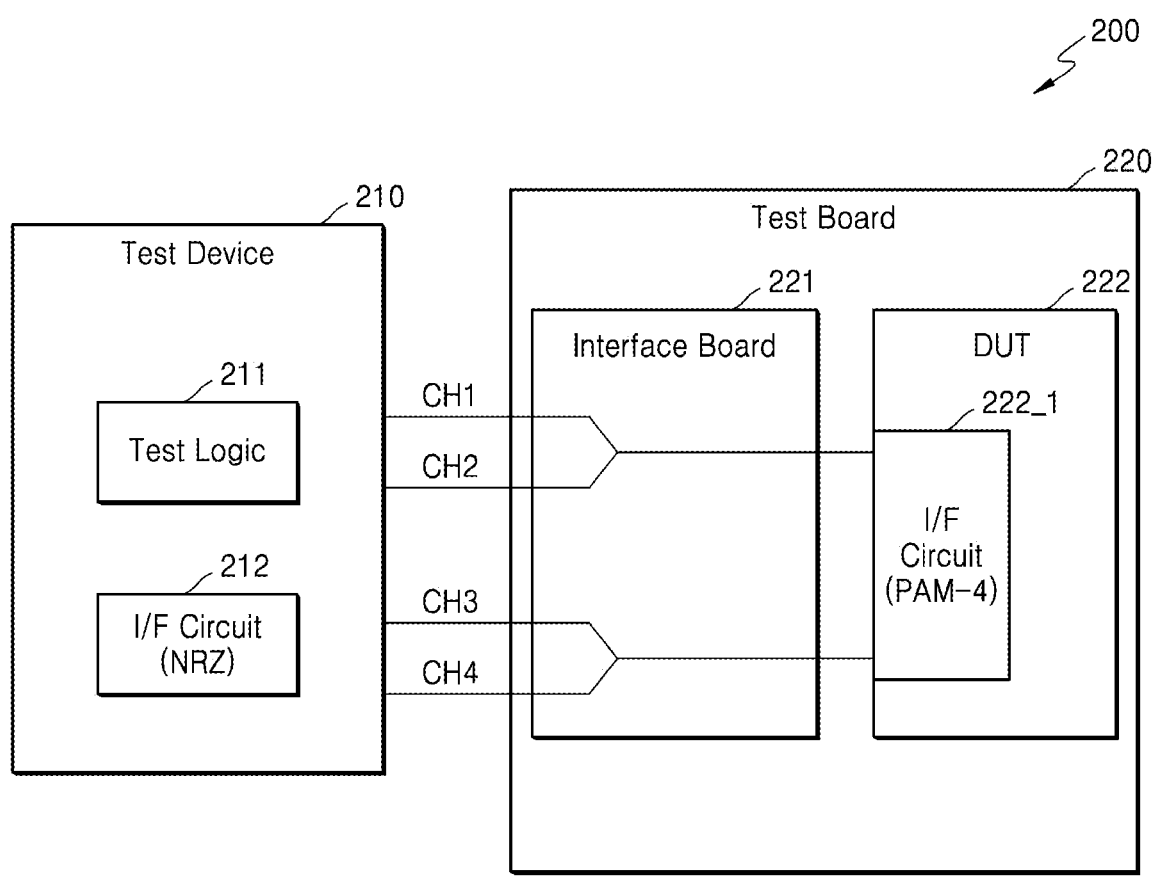
FIG. 4 is a block diagram illustrating an implementation example of a test system, according to some example embodiments.

FIG. 4 is a block diagram illustrating an implementation example of a test system 200, according to some example embodiments of the inventive concepts. In FIG. 4, an example is illustrated in which an interface board 221 including superposition lines is provided separately on a test board 220.

The test system 200 may include a test device 210 and the test board 220, and the test device 210 may include a test logic 211 and an I/F circuit (NRZ) 212. In addition, the test board 220 may include a socket (not illustrated) on which a DUT is mounted together with the interface board 221, and in FIG. 4, a DUT 222 mounted on the socket is illustrated. In addition, according to the above-described example embodiments, the DUT 222 may include an I/F circuit (PAM-4) 222_1 performing (e.g., configured to perform) an interface of the PAM-4 method.

According to the above-described example embodiments, the NRZ signals transmitted via two channels may be voltage-superposed in the interface board 221, and accordingly, a PAM signal satisfying the PAM method may be provided to the DUT 222. For example, two NRZ signals transmitted via the first channel CH1 and the second channel CH2 may be superposed and one PAM signal may be generated, and similarly to some example embodiments, two NRZ signals transmitted via a third channel CH3 and a fourth channel CH4 may be voltage-superposed and one PAM signal may be generated.

According to some example embodiments, the interface board 221 may be mounted in the test board 220, and the interface boards 221 different from each other may be mounted according to an interface type of the DUT 222 to be tested. In some example embodiments, including the example embodiments of FIG. 4, an example is illustrated in which the interface board 221 including the superposition lines in the above-described example embodiments is mounted as the DUT 222 performs the interface of the PAM method, but when the DUT 222 performs the interface of the NRZ method, the interface board 221 may be mounted in which wirings are arranged so that the NRZ signals are transmitted in parallel via the multiple channels without performing the voltage-superposition. In addition, the test device 210 may differently set an output operation of the test signal (for example, the voltage level of the NRZ signal) for some example embodiments of testing the DUT 222 of the PAM method and some example embodiments of testing the DUT 222 of the NRZ method, by using a control operation of an internal test mode, and in addition, may differently set a determination operation of the logic state of data from the test result. The test device 210 may determine whether the DUT 222 passes the test and may generate a pass/fail signal indicated whether the DUT 222 passes the test based on a determined logic state of data from the test result.

In the following example embodiments, as a testing system may be implemented in various ways, the terms of a test board and an interface board may be used mixed with each other. However, the scope of the example embodiments is not be limited by the terms.

Figure 5A:
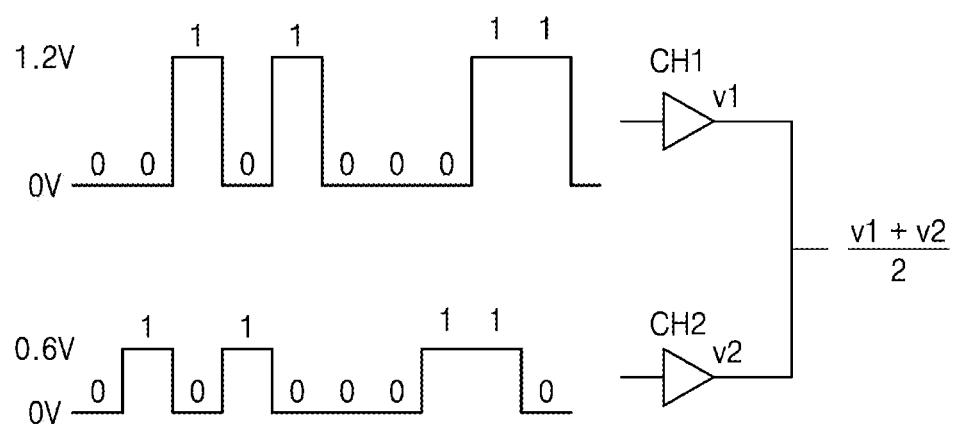
FIGS. 5A and 5B are diagrams illustrating logic states of signals transmitted via a first channel, a second channel, and a first DUT channel, according to some example embodiments.
Figure 5B:
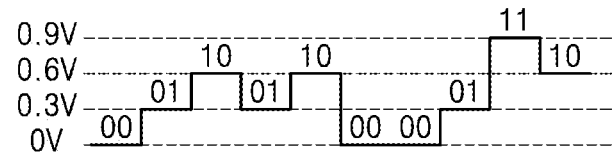

FIGS. 5A and 5B are diagrams illustrating logic states of signals transmitted via a first channel CH1, a second channel CH2, and a first DUT channel DCH1, according to some example embodiments. According to the above-described example embodiments, the first and second channels CH1 and CH2 may transmit a first NRZ signal and a second NRZ signal, and the first DUT channel DCH1 may transmit the superposition signal to the DUT. As noted above, a first driver of the Tx/Rx circuit 113 may generate a first NRZ signal according to a logic state of a first bit among the multiple bits generated by the logic generation/determination device 112 and output the generated first NRZ signal via the first channel CH1 and a second driver of the Tx/Rx circuit 113 may generate the second NRZ signal according to a logic state of a second bit among the multiple bits generated by the logic generation/determination device 112 and output the generated second NRZ signal via the second channel CH2.

Referring to FIGS. 5A and 5B, a test pattern including multiple bits may be generated, and the first NRZ signal and the second NRZ signal may be generated in parallel in units of 2 bits for the multiple bits. High levels of a logic state of '1' of the first NRZ signal and the second NRZ signal may be set different from each other, and example embodiments in which a high level v1 corresponding to the logic state of '1' may correspond to about 1.2 V, and a high level v2 corresponding to the logic state of '1' of the second NRZ signal may correspond to about 0.6 V is illustrated as an example in FIGS. 5A and 5B. Accordingly, the first NRZ signal may have a first high level (e.g., v1) or a first low level according to the logic state of the first bit (according to which the first NRZ signal may be generated by a first driver), and the second NRZ signal may have a second high level (e.g., v2) or a second low level according to the logic state of the second bit (according to which the second NRZ signal may be generated by a second driver), where the first high level may be different (e.g., different in magnitude) from the second high level (e.g., v1 may be greater than v2 as shown in at least FIG. 5A). In FIG. 5A, the first and second low levels are both 0 V, but example embodiments are not limited thereto, and in some example embodiments the first and second low levels may be different (e.g., may have different magnitudes) from each other.

According to the above-described example embodiments, as the first and second NRZ signals are output via the first channel CH1 and the second channel CH2, a superposition signal including information of 2 bits may be transmitted via the first DUT channel DCH1. The superposition signal may have a level corresponding to an average value of the high level v1 of the first NRZ signal and the high level v2 of the second NRZ signal. As illustrated in FIG. 5B, when the logic states of the first and second NRZ signals are '0', a superposition signal corresponding to a logic state of '00' may be transmitted. In addition, similarly to these example embodiments, when the logic state of the first NRZ signal is '0' and the logic state of the second NRZ signal is '1', a superposition signal corresponding to a logic state of '01' may be transmitted. In addition, when the logic state of the first NRZ signal is '1' and the logic state of the second NRZ signal is '0', a superposition signal corresponding to a logic state of '10' may be transmitted. In addition, when logic states of the first and second NRZ signals are '1', a superposition signal corresponding to a logic state '11' may be transmitted. In addition, as illustrated in FIG. 5B, voltage levels of superposition signals corresponding to logic states of '00', '01', '10', and '11' may be different from each other, and example embodiments, in which voltage levels corresponding to the logic states are about 0 V, about 0.3 V, about 0.6 V, and about 0.9 V, is illustrated as an example.

Figure 6:
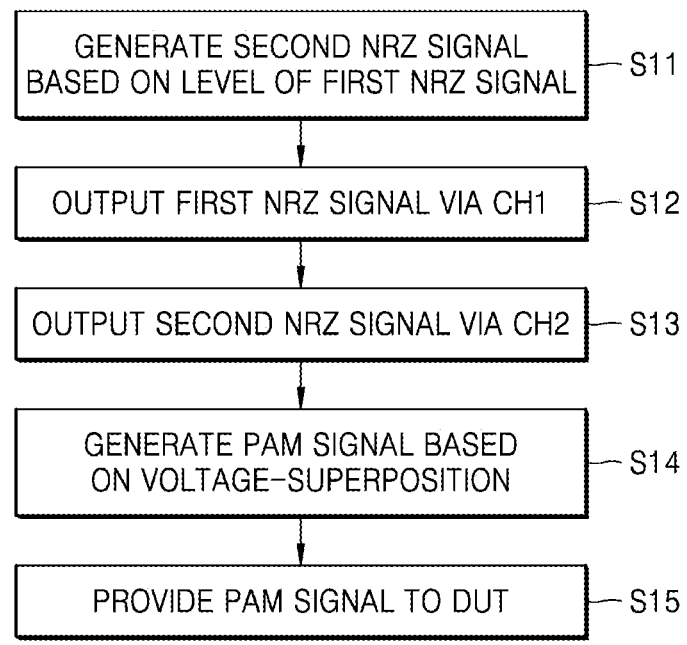
FIGS. 6 and 7 are flowcharts of operating methods of a test system, according to some example embodiments.
Figure 7:
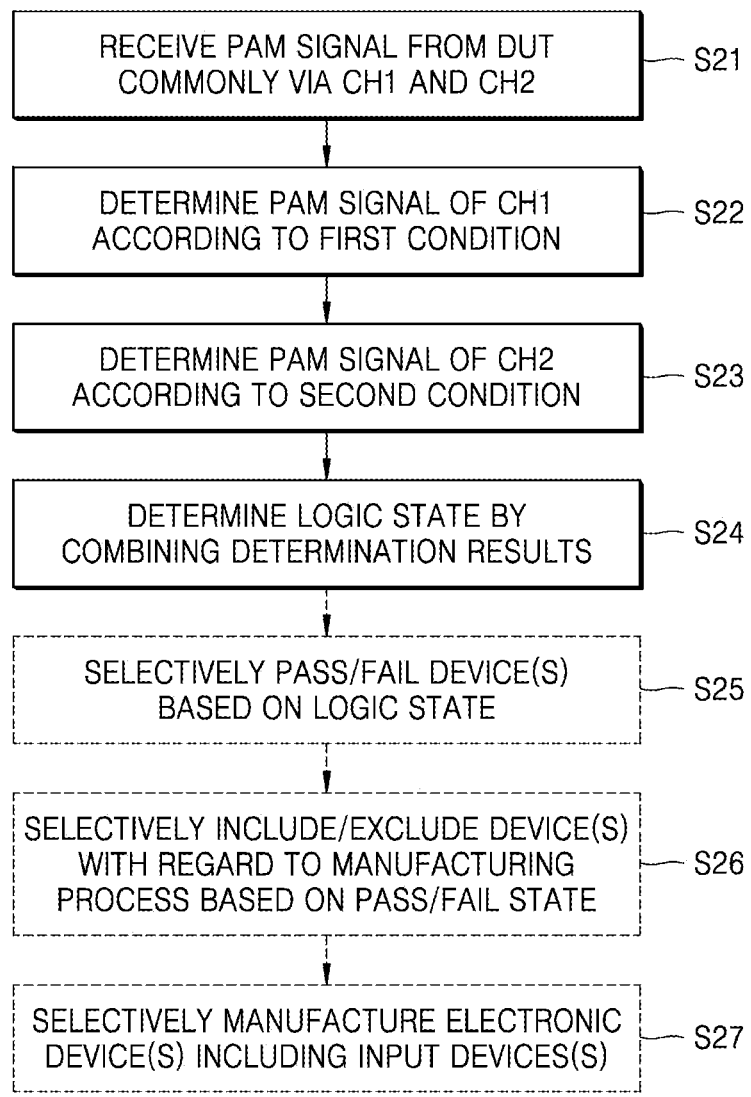

FIGS. 6 and 7 are flowcharts of operating methods of a test system, according to some example embodiments. An operation example of example embodiments in which a test device provides a test signal to a DUT is illustrated in FIG. 6, and an operation example of example embodiments in which a test result from the DUT is provided to the test device is illustrated in FIG. 7.

The operating methods shown in FIGS. 6-7 may be performed by any of the example embodiments of the test system and/or manufacturing system, including any embodiments of the test board and/or the test device and/or manufacturing system control device. In some example embodiments, operations shown in FIGS. 6 and/or 7 may be omitted from the operating methods of the test system and/or may be performed in different orders than shown in FIGS. 6-7. In some example embodiments the at least some of the operations of the methods shown in FIGS. 6-7 may be performed in sequence (e.g., the method of FIG. 7 performed subsequently to the method of FIG. 6 being performed) and/or at least partially in parallel (e.g., the methods of FIGS. 6 and 7 being performed at least partially in parallel in a given test system and/or manufacturing system).

In some example embodiments, including example embodiments illustrated in FIGS. 6 and 7, the test system may include a test device that does not support (e.g., does not include) an PAM-4 interface (e.g., PAM-4 interface circuit), and the DUT as a test object including a PAM-4 interface circuit, and various signals may be transmitted between the test device and the DUT via a test board (or, an interface board). Hereinafter, it is assumed that the test device outputs a first NRZ signal via a first channel, and the test device outputs a second NRZ signal via a second channel, one DUT channel (for example, a first DUT channel) corresponding to the first and second channels is arranged, and the DUT receives a test signal via the first DUT channel.

The test device may generate the first NRZ signal to be output via the first channel according to a logic state of a first bit of data among multiple bits corresponding to a test pattern, and generate the second NRZ signal to be output via the second channel according to a logic state of the second bit of data among the multiple bits corresponding to the test pattern, and the first NRZ signal and the second NRZ signal may be voltage-superposed on the interface board. A superposed signal may have a waveform satisfying a PAM-4 method, and accordingly, levels of the first NRZ signal and the second NRZ signal may be related to each other. Accordingly, the first NRZ signal and the second NRZ signal may be voltage-superposed via a superposition line formed on a test board and provided as a test signal to the DUT, where the test signal may have a voltage level satisfying the PAM-4 method (e.g., PAM-4 operation). For example, the second NRZ signal may be generated based on a level of the first NRZ signal (S11).

As the NRZ signal includes only information of one bit, each of the first NRZ signal and the second NRZ signal may have two voltage levels according to the logic state. For example, the first NRZ signal may have a first high level or a first low level according to the logic state of the first bit, the second NRZ signal may have a second high level or a second low level according to the logic state of the second bit, the first high level may be different from the second high level, and the first low level may be different from the second low level. For example, in setting the levels of the first NRZ signal and the second NRZ signal, the second high level may be decreased when the first high level is increased. Similarly to these example embodiments, when the first low level is increased, the second low level may be set to be decreased.

The test device may output the first NRZ signal via the first channel (S12), and output the second NRZ signal via the second channel (S13), and may generate a PAM signal satisfying the PAM method as the first NRZ signal and the second NRZ signal are voltage-superposed over each other via a superposition line of the interface board (S14). It will be understood that operation S14 may include generating a PAM signal that satisfies the PAM method based on voltage-superposing the first NRZ signal and the second NRZ signal. The PAM signal may be provided to the DUT via the first DUT channel, for example provided as a test signal to the DUT (S15), and the DUT may determine the logic state of the data of 2 bits from the PAM signal by using a processing operation (for example, a demodulation operation) on the PAM signal based on the PAM interface.

In some example embodiments, referring to FIG. 7, the test device may receive the PAM signal according to the PAM method from the DUT, and as an example, may commonly receive the PAM signal via the first channel and the second channel (S21). For example, a PAM signal comprising information of at least 2 bits from the DUT may be transmitted to a superposition line of the test board as a test result, and the test result may be provided in parallel to the test device via the first and second channels CH1 and CH2.

For example, the PAM signal may include a signal having any one level of four voltage levels, and the logic state of the PAM signal may be determined by a comparator arranged in each of the first channel and the second channel. As an example, a determination operation on the PAM signal received via the first channel may be performed according to a first condition (S22), and a determination operation on the PAM signal received via the second channel may be performed according to a second condition (S23).

As different determination conditions from each other are applied to the same PAM signal, various combinations of determination results may be generated. For example, the test device may perform the determination operation of the logic state based on the NRZ interface, and accordingly, two determination results (for example, logic low and logic high) may occur in each of the first channel and the second channel. For example, a first comparison of the PAM signal comprising information of at least 2 bits received as a test result from the DUT via the first channel to a first reference voltage may be performed, and a second comparison of the PAM signal received via the second channel in parallel with the first channel to a second reference voltage may be performed. A level of the first reference voltage may be different from a level of the second reference voltage. The logic state of the PAM signal may be determined by combining the determination results of the first and second channels (S24), and as an example, the logic state of data of 2 bits may be determined according to the level of the PAM signal. For example, a logic state of the test result based on a combination of a first comparison result of the first comparison and a second comparison result of the second comparison may be determined.

A selective determination may be made whether the DUT from which the PAM signal is received at S21 passes a test based on processing the logic state that is determined at S24 (S25). Such selective determination at S25 may include generating a pass/fail signal indicating whether the DUT passes the test based on the determined logic state. For example, in response to determination that the logic state of the data of 2 bits corresponds to '00', the DUT may be determined at S25 to have failed the test and a pass/fail signal indicating that the DUT has failed the test may be generated. In another example, in response to determination that the logic state of the data of 2 bits corresponds to '11', the DUT may be determined at S25 to have passed the test and a pass/fail signal indicating that the DUT has passed the test may be generated.

One or more memory devices may be selectively included in, or excluded from, one or more inputs of a manufacturing process to manufacture one or more electronic devices (S26). For example the pass/fail signal generated at S25 may be transmitted to a control device (e.g., control device 99_1) which may process the pass/fail signal to determine whether the DUT has failed the test.

In response to determining that the DUT has passed the test, the control device may generate one or more control signals to cause one or more devices (e.g., actuator device 99_2 and/or manufacturing device 99_3) to selectively include (e.g., divert, direct, etc.) one or more certain memory devices associated with the DUT (e.g., memory devices 777 and/or the DUT itself) to be part of an input to the manufacturing system 99 (e.g., input to manufacturing device 99_3) so that the certain memory devices are, or are included in, the one or more manufactured electronic devices 888 that are manufactured by the manufacturing device 99_3. Said one or more memory devices selectively caused to be included as the input may include the DUT from which the PAM signal is received at S21 and/or may be separate memory devices (e.g., a batch of memory devices from which the DUT is selected for testing).

In response to determining that the DUT has failed the test, the control device may generate one or more control signals to cause one or more devices (e.g., actuator device 99_2 and/or manufacturing device 99_3) to selectively exclude (e.g., divert, discard, etc.) one or more certain memory devices associated with the DUT (e.g., memory devices 777 and/or the DUT itself) from being part of an input to the manufacturing system 99 (e.g., input to manufacturing device 99_3) so that the certain memory devices are excluded from being, or being included in, the one or more manufactured electronic devices 888. Said excluded devices may be selectively diverted (e.g., by the actuator device 99_2 and/or manufacturing device 99_3) to a discard area to be discarded, salvaged, repaired, or the like. Said one or more memory devices selectively caused to be excluded may include the DUT from which the PAM signal is received at S21 and/or may be separate memory devices (e.g., a batch of memory devices from which the DUT is selected for testing).

One or more electronic devices (e.g., electronic devices 888) may be manufactured based on selectively included input memory devices (S27), which may include or exclude the memory devices 777 and/or DUT pursuant to the outcome of S26. As a result, the testing of the DUT may selectively affect which memory devices are included in the manufactured electronic devices 888). Restated, one or more methods according to some example embodiments may include manufacturing one or more electronic devices (e.g., electronic devices 888) such that one or more particular memory devices associated with the DUT (e.g., memory devices 777 and/or the DUT itself) are selectively included in or excluded from the one or more manufactured electronic devices, based on the determined logic state of the test result.

FIG. 8 is a table illustrating examples of voltage levels of signals output by a test device, according to some example embodiments. According to the above-described example embodiments, the test device may output the first NRZ signal via the first channel CH1, and output the second NRZ signal via the second channel CH2, and according to the above-described example embodiments, the first NRZ signal and the second NRZ signal may be voltage-superposed on the interface board. In addition, a length of a first conductive line connected to the first channel CH1 may be the same or substantially the same as a length of a second conductive line connected to the second channel CH2, and a superposition signal corresponding to an average value of the levels of the first NRZ signal and the second NRZ signal may be provided to the DUT via a third conductive line.

According to some example embodiments, a voltage level of the first NRZ signal may be different from a voltage level of the second NRZ signal. As an implementation example, the test device may include a first driver for generating the first NRZ signal based on a logic state of a first bit of bits generated by a generation/determination device and a second driver for generating the second NRZ signal based on a logic state of a second bit of the bits generated by a generation/determination device, and for adjusting the levels of the first NRZ signal and the second NRZ signal, a method of adjusting a level of a power voltage provided to the first driver and the second driver may be applied. In some example embodiments, as another implementation example, example embodiments may be implemented so that the same power voltage is provided to the first driver and the second driver, and each of the first driver and the second driver drives a signal by using different driving capabilities from each other.

The first NRZ signal and the second NRZ signal may, when the levels thereof are voltage-superposed, be set so that the voltage levels of the superposition signals match the four voltage levels required in the PAM-4 method. For example, assuming that the power voltage of a driver provided in the PAM-4 interface circuit is VDDQ, the four voltage levels required in the PAM-4 method may have values of 0, ⅓*VDDQ, ⅔*VDDQ, and VDDQ. In some example embodiments, when the first NRZ signal and the second NRZ signal are voltage-superposed, the levels of the first NRZ signal and the second NRZ signal may be set to have the above-described four voltage levels. In addition, the above-described power voltage VDDQ may have a voltage level according to various specifications of a semiconductor device as the DUT, and as an example, when the DUT includes a memory device including a memory cell array, may have a voltage level of about 1.2 V or a value similar thereto.

In FIG. 8, two examples to which example embodiments are applicable are illustrated, and a level may be set so that a sum of the high level of the first NRZ signal and the high level of the second NRZ signal is a value of 2*VDDQ. As an example, like in a first case Case 1, the first NRZ signal may have a value of 4/3*VDDQ or 0 according to the logic state of data, and the second NRZ signal may have a value of ⅔*VDDQ or 0 according to the logic state of data. In some example embodiments, the level of the first NRZ signal may be different from the level of the second NRZ signal according to a value of 2 bits of data to be transmitted, and as an example, when the test device transmits data of '11', the first NRZ signal may have a level of 4/3*VDDQ according to any one bit (for example, the most significant bit (MSB)) of the data of '11', and the second NRZ signal may have a level of ⅔*VDDQ according to the other bit (for example, the least significant bit (LSB)). In addition, similar to these example embodiments, when the test device transmits data of '10', the first NRZ signal may have a level of 4/3*VDDQ and the second NRZ signal may have a level of 0. In addition, when the test device transmits data of '01', the first NRZ signal may have a level of 0 and the second NRZ signal may have a level of ⅔*VDDQ, and when the test device transmits data of '00', the first NRZ signal and the second NRZ signal may have a level of 0.

However, a second case Case 2 illustrates an example in which the logic high level and the logic low level of the first and second NRZ signals are all set different from each other. As an example, the first NRZ signal may have a value of 4/3*VDDQ or ⅔*VDDQ according to the logic state of data, and the second NRZ signal may have a value of ⅔*VDDQ or −⅔*VDDQ according to the logic state of data. Even in the second case Case 2, when the first NRZ signal and the second NRZ signal are voltage-superposed, the superposition signal may have four levels of 0, ⅓*VDDQ, ⅔*VDDQ, and VDDQ.

Accordingly, it will be understood that, in some example embodiments, where the first NRZ signal and the second NRZ signal are voltage-superposed via a superposition line formed on a test board, and provided as a test signal to the DUT, and the test signal has a voltage level satisfying a PAM-4 operation, the test signal may have any one level of a power voltage (VDDQ), ⅔*VDDQ, ⅓*VDDQ or 0 V based on the PAM-4 method, and a sum of the first high level and the second high level may be 2*VDDQ.

However, the levels of the first NRZ signal and the second NRZ signal according to example embodiments are not limited to the numerical numbers shown in FIG. 8, and may be variously changed within a limit in which the voltage-superposed levels satisfy the voltage levels required by the PAM-4 method.

Figure 9:
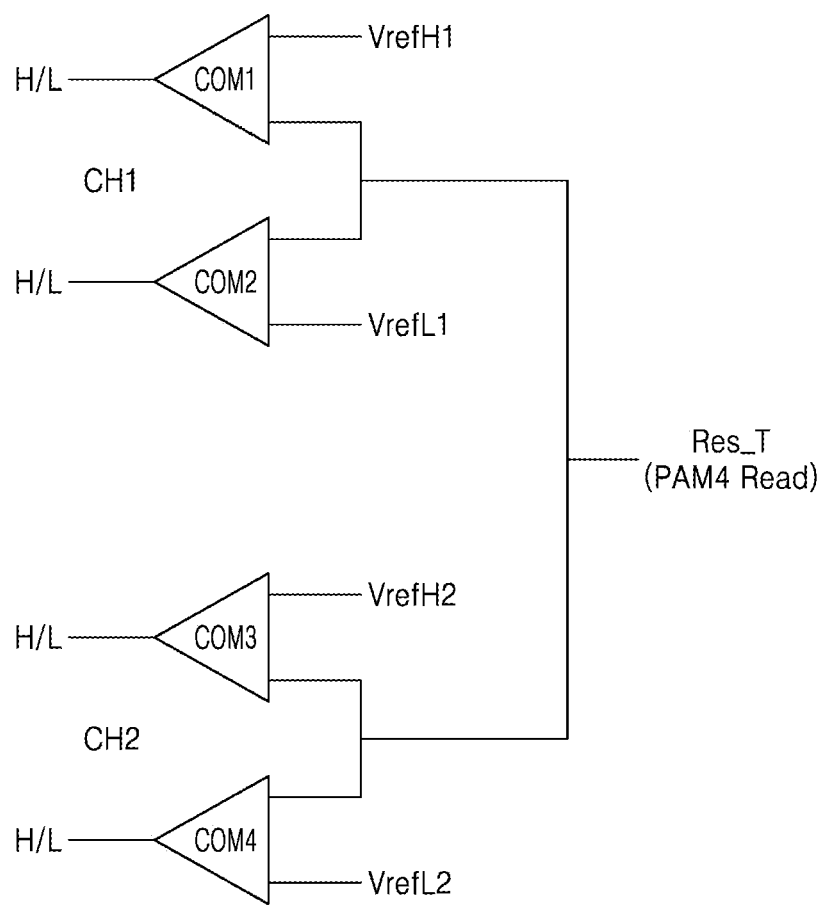
FIGS. 9, 10A, and 10B are drawings illustrating examples of determining logic states of data from test results by a test device, according to some example embodiments.
Figures 10A, 10B:
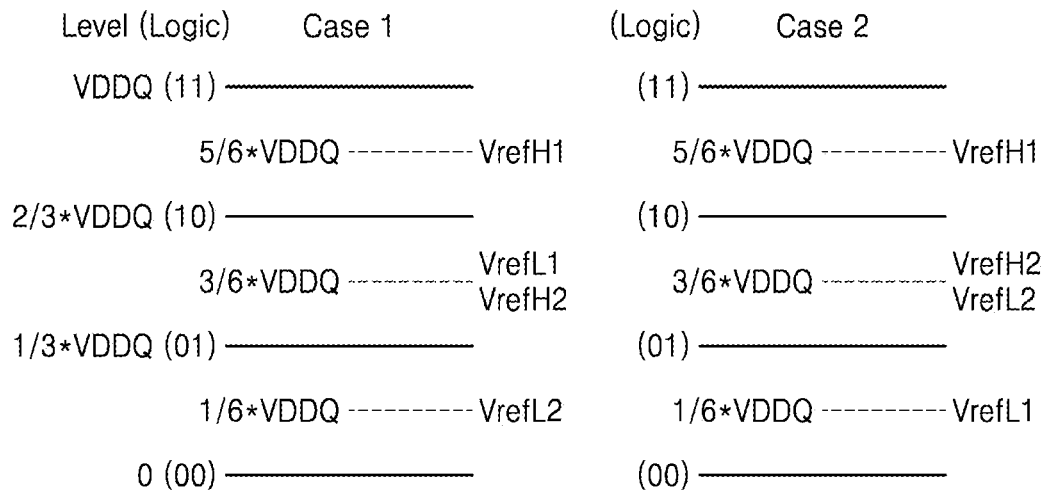

FIGS. 9, 10A, and 10B are diagrams illustrating examples of determining logic states of data from test results by a test device, according to some example embodiments.

FIG. 9 illustrates an implementation example of a comparator provided in the test device, and in FIG. 9, an example is illustrated in which three or more states of a signal in each channel are determined, as two or more comparators corresponding to each channel are arranged. In addition, each comparator may compare the test result received via a corresponding channel to a certain reference voltage, and output the comparison result. Further, in some example embodiments, a logic high state, a logic low state, and a high resistance (Hi-Z) state may be determined according to the comparison result of two comparators corresponding to each channel.

The data read from the DUT may be modulated by using the PAM-4 method, and may be commonly provided to the first channel CH1 and the second channel CH2 via the interface board as a test result Res_T. In addition, a first comparator COM1 and a second comparator COM2 may be arranged corresponding to the first channel CH1, the first comparator COM1 may output a result of comparing the test result Res_T to a first high reference voltage VrefH1, and the second comparator COM2 may output a result of comparing the test result Res_T to a first low reference voltage VrefL1. In addition, a third comparator COM3 and a fourth comparator COM4 may be arranged corresponding to the second channel CH2, the third comparator COM3 may output a result of comparing the test result Res_T to a second high reference voltage VrefH2, and the fourth comparator COM4 may output a result of comparing the test result Res_T to a second low reference voltage VrefL2.

According to some example embodiments, a level of the first high reference voltage VrefH1 may be different from a level of the second high reference voltage VrefH2. In addition, a level of the first low reference voltage VrefL1 may be different from a level of the second low reference voltage VrefL2. Accordingly, even when the same test result Res_T is received, different determination results from each other may be generated in the first channel CH1 and the second channel CH2, and the logic state of the test result Res_T of 2 bits may be determined by combining the determination results.

The test device may further determine whether the DUT from which the data is read (e.g., from which a PAM signal is received) passes a test based on processing the determine logic state of the test result Res_T and may generate a pass/fail signal indicating whether the DUT passes the test based on the determined logic state of the test result Res_T. The pass/fail signal may be transmitted to a control device (e.g., control device 99_1) which may cause one or more memory devices to be selectively included or excluded (e.g., diverted, discarded, etc.) from a manufacturing process (e.g., from being included as inputs to manufacturing device 99_3).

The determination operation according to some example embodiments will be described below with reference to FIGS. 10A and 10B. Two implementable examples are illustrated in some example embodiments, including the example embodiments of FIGS. 10A and 10B, and in the first case Case 1, an example is illustrated in which the first high reference voltage VrefH1 has a level of ⅚*VDDQ, the first low reference voltage VrefL1 and the second high reference voltage VrefH2 have a level of ⅗*VDDQ, and the second low reference voltage VrefL2 has a level of ⅙*VDDQ. In addition, in the second case Case 2, an example is illustrated in which the first high reference voltage VrefH1 has a level of ⅚*VDDQ, the second high reference voltage VrefH2 and the second low reference voltage VrefL2 have a level of ⅗*VDDQ, and the first low reference voltage VrefL1 has a level of ⅙*VDDQ.

Referring to FIG. 10B, in the first case Case 1, four voltage levels of the test result Res_T may be determined based on the determination results of the first channel CH1 and the second channel CH2, and by using the determination result, the logic state of 2 bits may be determined. For example, when the determination results of the first channel CH1 and the second channel CH2 are logic highs H, it may be determined that the level of the test result Res_T corresponds to VDDQ, and the logic state of the test result Res_T may be '11'. In addition, when the determination result of the first channel CH1 corresponds to Hi-Z and the determination result of the second channel CH2 corresponds to logic high H, it may be determined that the level of the test result Res_T corresponds to ⅔*VDDQ, and the logic state of the test result Res_T is '10'. In addition, when the determination result of the first channel CH1 corresponds to logic low L and the determination result of the second channel CH2 corresponds to Hi-Z, it may be determined that the level of the test result Res_T corresponds to ⅓*VDDQ, and the logic state of the test result Res_T is '01'. In addition, when the determination results of the first channel CH1 and the second channel CH2 are logic lows L, it may be determined that the level of the test result Res_T corresponds to 0, and the logic state of the test result Res_T may be '00'.

Similar to the first case Case 1, in the second case Case 2, based on conditions set in the second case Case 2, when the determination result of the first channel CH1 corresponds to Hi-Z and the determination result of the second channel CH2 corresponds to logic low L, it may be determined that the level of the test result Res_T corresponds to ⅓*VDDQ.

Accordingly, in some example embodiments, a test device according to some or any of the example embodiments may include a first comparator COM1 and a second comparator COM2 configured to receive, in parallel a PAM signal that includes information of at least 2 bits from the DUT via the first channel CH1 as a test result Res_T, and the test device may further include a third comparator COM3 and a fourth comparator COM4 configured to receive in parallel the PAM signal via the second channel CH2. The first comparator COM1 may be configured to compare the PAM signal to a first high reference voltage VrefH1, the second comparator COM2 may be configured to compare the PAM signal to a first low reference voltage VrefL1, the third comparator COM3 may be configured to compare the PAM signal to a second high reference voltage VrefH2, and the fourth comparator COM4 may be configured to compare the PAM signal to a second low reference voltage VrefL2, and a level of the first high reference voltage VrefH1 may be different from a level of the second high reference voltage VrefH2. In some example embodiments, a level of the first low reference voltage VrefL1 may be different from a level of the second low reference voltage VrefL2. In some example embodiments, the logic generation/determination device of the test device (e.g., logic generation/determination device 112) may determine a logic state of the test result Res_T based on combining comparison results of the first, second, third, and fourth (e.g., first through fourth) comparators COM1 to COM4. In some example embodiments, any one of a logic high state, a logic low state, or a high resistance (Hi-Z) state of the PAM signal may be determined based on a combination of comparison results of the first and second comparators COM1 and COM2, any one of the logic high state, the logic low state, or the Hi-Z state of the PAM signal may be determined based on a combination of comparison results of the third and fourth comparators COM3 and COM4, and the combination of comparison results of the first and second comparators COM1 and COM2 may be different from the combination of comparison results of the third and fourth comparators COM3 and COM4.

Figure 11:
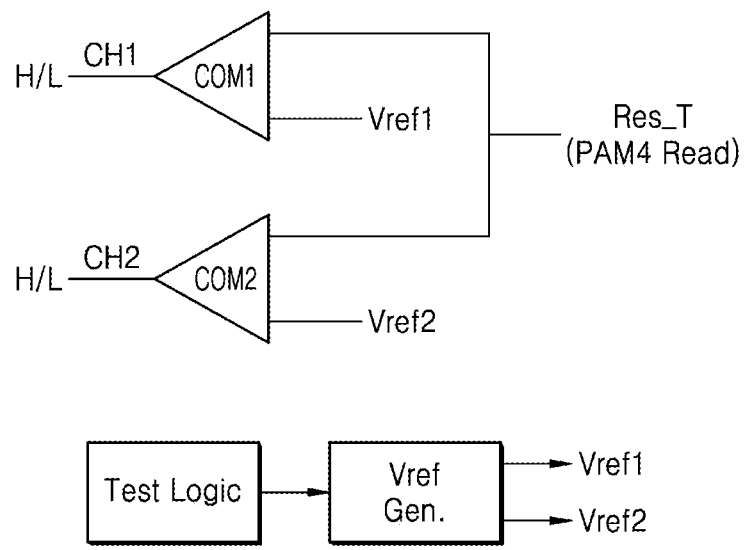
FIGS. 11, 12A, and 12B are drawings illustrating examples in which a test device determines logic states, according to some example embodiments.
Figures 12A, 12B:
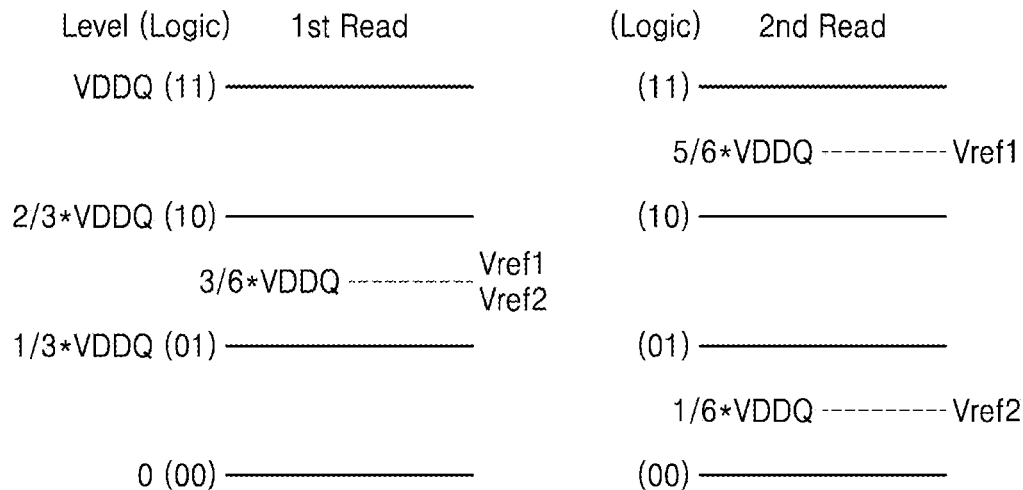

FIGS. 11, 12A, and 12B are diagrams illustrating examples in which a test device determines logic states, according to some example embodiments. In FIGS. 11, 12A, and 12A, as one comparator is arranged in correspondence to each channel, the example is illustrated to which the example embodiments are applied when only logic high or logic low may be determined in each channel.

Referring to FIG. 11, data read from the DUT may be modulated according to the PAM-4 method and commonly provided to the first channel CH1 and the second channel CH2 via the interface board as the test result Res_T, and the test result Res_T may be commonly provided to the first comparator COM1 arranged in correspondence to the first channel CH1 and the second comparator COM2 arranged in correspondence to the second channel CH2. The first comparator COM1 may output a result of comparing the test result Res_T to the first reference voltage Vref1, and the second comparator COM2 may output a result of comparing the test result Res_T to the second reference voltage Vref2. Accordingly, each of the first comparator COM1 and the second comparator COM2 may output the comparison result of logic high H or logic low L according to the level of the test result Res_T to be input.

According to some example embodiments, a level of the first reference voltage Vref1 may be different from a level of the second reference voltage Vref2. In addition, to determine four voltage levels according to a PAM-4 waveform, a read operation on the same data from the DUT may be performed twice, and the level of the test result Res_T may be determined based on a combination of a comparison result in a first read operation and a comparison result in a second read operation. In addition, in the first read operation and in the second read operation, at least one of the first reference voltage Vref1 or the second reference voltage Vref2 described above may have a level thereof varied. In FIG. 11, a reference voltage generator Vref Gen for generating the first reference voltage Vref1 and the second reference voltage Vref2 is illustrated, and an example is further illustrated in which a test logic controls levels of the first reference voltage Vref1 and the second reference voltage Vref2 in the first read operation and the second read operation, respectively.

Referring to FIGS. 12A and 12B, an example is illustrated in which four voltage levels of the test result Res_T are logically determined based on the determination results of the first read operation and the second read operation. For example, assuming that, like in FIG. 12A, in the first read operation, the first reference voltage Vref1 and the second reference voltage Vref2 have a level of ⅗*VDDQ, and in the second read operation, the first read operation has a level of ⅚*VDDQ and the second reference voltage Vref2 has a level of ⅙*VDDQ, the level of the test result Res_T may be determined based on a combination of determination results like those in FIG. 12B.

For example, when the determination results of the first channel CH1 and the second channel CH2 in both the first read operation and the second read operation are logic highs H, it may be determined that the level of the test result Res_T corresponds to VDDQ and the logic state of the test result Res_T is '11'. In addition, when in the first read operation, the determination results of the first channel CH1 and the second channel CH2 are logic highs H, and in the second read operation, the determination result of the first channel CH1 is logic low L and the determination result of the second channel CH2 is logic high H, it may be determined that the level of the test result Res_T corresponds to ⅔*VDDQ and the logic state of the test result Res_T is '10'. In addition, when in the first read operation, the determination results of the first channel CH1 and the second channel CH2 are logic lows L, and in the second read operation, the determination result of the first channel CH1 is logic low L and the determination result of the second channel CH2 is logic high H, it may be determined that the level of the test result Res_T corresponds to ⅓*VDDQ and the logic state of the test result Res_T is '01'. In addition, when the determination results of the first channel CH1 and the second channel CH2 in both the first read operation and the second read operation are logic lows L, it may be determined that the level of the test result Res_T corresponds to 0 and the logic state of the test result Res_T is '00'.

According to above-described example embodiments, four voltage levels of the test result Res_T according to the PAM-4 method may be determined based on two reference voltages (for example, Vref1 and Vref2), and accordingly, because the number (e.g., quantity) of circuit elements (for example, comparators) arranged in correspondence to each channel of a test device is reduced, an implemented area and power consumption of the test device may be reduced, and in addition, fabrication cost of the test device may be reduced.

Accordingly, in some example embodiments, a test device according to some or any of the example embodiments may include a first comparator COM1 configured to receive a PAM signal that includes information of at least 2 bits from the DUT via the first channel CH1, and compare the PAM signal to a first reference voltage Vref, and the test device according to some or any of the example embodiments may further include a second comparator COM2 configured to receive the PAM signal via the second channel CH2 in parallel with the first comparator COM1, and compare the PAM signal to a second reference voltage Vref2, wherein, as a first read operation and a second read operation are performed on an identical piece of data from the DUT, a test result Res_T is continuously provided to the first comparator COM1 and the second comparator COM2, and in the first and second read operations, a level of at least one of the first reference voltage Vref1 or the second reference voltage Vref2 may be changed (e.g., varied). In some example embodiments, in one of the first read operation or the second read operation, a level of the first reference voltage Vref1 and a level of the second reference voltage Vref2 may be set to be identical, and in another of the first read operation or the second read operation, the level of the first reference voltage Vref1 may be set to be different from the level of the second reference voltage Vref2. In some example embodiments, the logic generation/determination device of the test device (e.g., logic generation/determination device 112) may determine a logic state of the test result Res_T based on combining comparison results of the first and second comparators COM1 and COM2 in the first read operation, and combining comparison results of the first and second comparators COM1 and COM2 in the second read operation.

Accordingly, based on a test device including at least the aforementioned first and second comparators COM1 and COM2 configured to operate as described above, a quantity of circuit elements in the test device may be reduced, and thus an implemented area and power consumption of the test device may be reduced, and in addition, fabrication cost of the test device may be reduced.

The test device may further determine whether the DUT from which the data is read (e.g., from which a PAM signal is received) passes a test based on processing the determined logic state of the test result Res_T and may generate a pass/fail signal indicating whether the DUT passes the test based on the determined logic state of the test result Res_T. For example, in response to a determination that the level of the test result Res_T corresponds to 0 and the logic state of the test result Res_T is '00', the test device may determine that the DUT has failed the test and may generate a pass/fail signal indicating that the DUT has failed the test. In another example, in response to a determination that the level of the test result Res_T corresponds to VDDQ and the logic state of the test result Res_T is '11', the test device may determine that the DUT has passed the test and may generate a pass/fail signal indicating that the DUT has passed the test. The pass/fail signal may be transmitted to a control device (e.g., control device 99_1) which may cause one or more memory devices to be selectively included or excluded (e.g., diverted, discarded, etc.) from a manufacturing process (e.g., from being included as inputs to manufacturing device 99_3).

Figure 13:
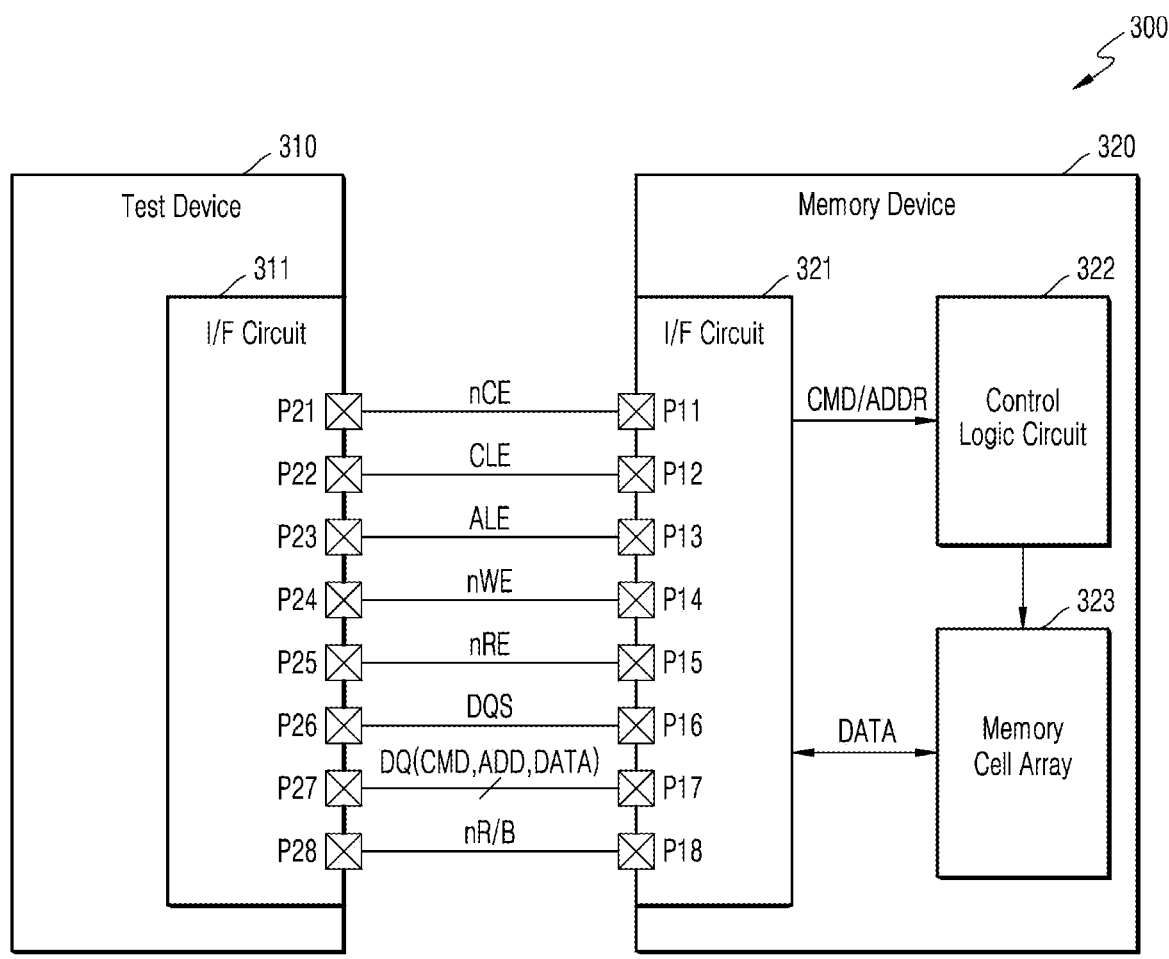
FIG. 13 is a block diagram illustrating a communication example between a test device and a memory device as a DUT, according to some example embodiments.

FIG. 13 is a block diagram illustrating a communication example between a test device 310 and a memory device 320 as the DUT, according to some example embodiments. As illustrated in FIG. 13, a test system 300 may include the test device 310, and the memory device 320 as the DUT may be mounted on a test board. According to example embodiments, the test board including one or more superposition lines may be further provided in the test system 300, but in FIG. 13, detailed illustrations related thereto are omitted.

The memory device 320 may include an I/F circuit 321, a control logic circuit 322, and a memory cell array 323. The I/F circuit 321 may communicate with the test device 310 via first through eighth pins P11 through P18. As an example, the memory device 320 may receive a chip enable signal nCE via the first pin P11, and when the chip enable signal nCE is in an enable state, may transceive various signals via the second through eighth pins P12 through P18.

In addition, the memory device 320 may receive a command latch enable signal CLE, an address latch enable signal ALE, and a write enable signal nWE via the second through fourth pins P12 through P14. In addition, the memory device 320 may transceive an input/output signal DQ via the seventh pin P17, and as an example, may receive command/address/data via the seventh pin P17, or transmit data to the test device 310. For example, the seventh pin P17 may include multiple pins, and the input/output signal DQ may be transmitted via a plurality of signal lines.

As an example, the memory device 320 may obtain a command CMD in an enable section of the command latch enable signal CLE based on toggle timings of the write enable signal nWE. In addition, the memory device 320 may obtain an address ADDR in an enable section of the address latch enable signal ALE based on toggle timings of the write enable signal nWE.

The memory device 320 may receive a read enable signal nRE via the fifth pin P15, a data strobe signal DQS via the sixth pin P16, or transmit the data strobe signal DQS to the test device 310. In an output operation of data DATA of the memory device 320, the data DATA may be transmitted to the test device 310 based on a toggle timing of the data strobe signal DQS. In addition, in a receive operation of the data DATA of the memory device 320, the data DATA may be obtained based on the toggle timing of the data strobe signal DQS from the test device 310. In addition, the memory device 320 may transmit a ready/busy output signal nR/B via the eighth pin P18 to the test device 310. As an example, when the memory device 320 is in a busy state (that is, when internal operations of the memory device 320 are performed), the memory device 320 may transmit the ready/busy output signal nR/B to the test device 310.

In some example embodiments, the control logic circuit 322 may control all operations of the memory device 320. The control logic circuit 322 may generate control signals for controlling other components of the memory device 320 according to a command and/or address CMD/ADDR obtained from the I/F circuit 321. For example, the control logic circuit 322 may store the data DATA in the memory cell array 323, or may generate various control signals for reading the data DATA from the memory cell array 323. The memory cell array 323 may store the data DATA obtained from the I/F circuit 321 under the control of the control logic circuit 322. The memory cell array 323 may output the stored data DATA to the I/F circuit 321 under the control of the control logic circuit 322.

In some example embodiments, the test device 310 may include an I/F circuit 311, and communicate with the memory device 320 via first through eighth pins P21 through P28. The first through eighth pins P21 through P28 of the test device 310 may correspond to the first through eighth pins P11 through P18 of the memory device 320, and because, for a communication operation thereof, descriptions given in relation to the memory device 320 may be referred to, detailed description thereof are omitted.

According to some example embodiments, referring to the I/F circuit 311 of the test device 310, pins to which superposition lines are applied may be applied to at least some of the above-described first through eighth pins P21 through P28. As an example, when a superposition line of example embodiments is applied to the seventh pin P27 transmitting command/address/data, signals transmitted via multiple pins included in the seventh pin P27 may be voltage-superposed via the superposition line. For example, the NRZ signals may be transmitted from two pins among the multiple pins included in the seventh pin P27, and the NRZ signals from the two pins may be voltage-superposed and provided to the memory device 320 as a PAM signal satisfying the PAM-4 method. In addition, according to some example embodiments, the test device 310 may output an NRZ signal related to the command/address/data, and the memory device 320 may receive the PAM signal related to the command/address/data. Accordingly, in some example embodiments, the test device 310 may perform a test on a DUT (e.g., memory device 320) based on transmitting a command, an address, and data to the DUT, and first and second bits (the logic states of which may be used to generate the first and second NRZ signals as described herein) may be any one of the command, the address, or the data.

FIGS. 14A, 14B, 15A, 15B, and 15C are diagrams of operation examples of a test system, according to some example embodiments. In FIGS. 14A, 14B, 15A, 15B, and 15C, the PAM-8 method may be illustrated among various PAM-N interface methods.

Figures 14A, 14B:
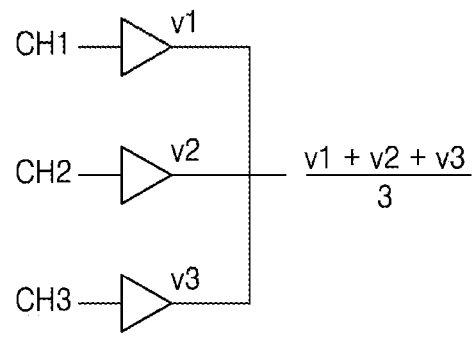

Referring to FIG. 14A, as the NRZ signals are output via the first through third channels CH1 through CH3, and three NRZ signals are voltage-superposed via the superposition line, the superposition signal may have a level corresponding to an average value of (v1+v2+v3)/3 of first through third NRZ signals of high levels. In addition, voltage levels of the first through third NRZ signals may be set so that the superposition signal satisfies the PAM method.

In some example embodiments, an operation method of a test system, for example as described with reference to FIGS. 6-7, may include, in addition to outputting the first and second NRZ signals according to respective logic states of respective first and second bits among multiple bits corresponding to a test pattern via respective first and second channels, outputting a third NRZ signal according to a logic state of a third bit among the multiple bits via a third channel, where the third NRZ signal may have a third high level or a third low level according to the logic state of the third bit. The PAM signal may be generated based on voltage-superposing the first through third NRZ signals and provided as a test signal to the DUT (S14-S15), and as the first through third NRZ signals are voltage-superposed, the test signal may have any one of N voltage levels, wherein N may be an integer equal to or greater than 5. According to an implementation example, in the PAM-8 method, the superposition signal may include information of 3 bits, and the superposition signal may have, as eight levels, values of 0, $\frac{1}{7}$*VDDQ, $\frac{2}{7}$*VDDQ, $\frac{3}{7}$*VDDQ, $\frac{4}{7}$*VDDQ, $\frac{5}{7}$*VDDQ, $\frac{6}{7}$*VDDQ, and VDDQ. In addition, as illustrated in FIG. 14B, to ensure that the first through third NRZ signals have the above-described voltage levels when voltage-superposed, the first NRZ signal transmitted via the first channel CH1 may have a value of 12/7*VDDQ or 0 according to the logic state, the second NRZ signal transmitted via the second channel CH2 may have a value of $\frac{6}{7}$*VDDQ or 9 according to the logic state, and the third NRZ signal may have a value of $\frac{3}{7}$*VDDQ or 0 according to the logic state. However, example embodiments are not limited to examples illustrated in FIGS. 14A and 14B, and the PAM-6, PAM-8, and PAM-16 methods may be applied by setting other various voltage levels.

Figure 15A:
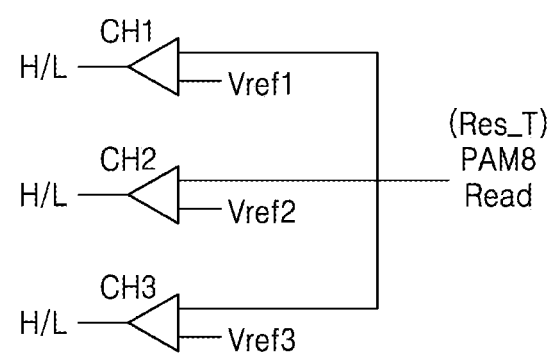

In FIGS. 15A, 15B, and 15C, an example is illustrated in which a test device processes test results corresponding to the PAM-8 signal. In FIG. 15A, an example is illustrated in which the test result Res_T including information of 3 bits is commonly provided via the first through third channels CH1 through CH3, and comparators arranged in correspondence to the first through third channels CH1 through CH3 receive the test result Res_T. The comparator of the first channel CH1 may compare the test result Res_T to the first reference voltage Vref1, the comparator of the second channel CH2 may compare the test result Res_T to the second reference voltage Vref2, and the comparator of the third channel CH3 may compare the test result Res_T to the third reference voltage Vref3.

In FIG. 15B, an example is illustrated in which the read operation is performed three times on the same data from the DUT, and the test result Res_T may be provided in each read operation. In addition, the levels of the first through third reference voltages Vref1 through Vref3 may vary, and as an example, in a comparison operation using the test result Res_T read in a first read operation, the first through third reference voltages Vref1 through Vref3 may have a level of $7/14*VDDQ$. In addition, in a comparison operation using the test result Res_T read in a second read operation, the first reference voltage Vref1 may have a level of $13/14*VDDQ$, the second reference voltage Vref2 may have a level of $11/14*VDDQ$, and the third reference voltage Vref3 may have a level of $9/14*VDDQ$. In addition, in a comparison operation using the test result Res_T read in a third read operation, the first reference voltage Vref1 may have a level of $5/14*VDDQ$, the second reference voltage Vref2 may have a level of $3/14*VDDQ$, and the third reference voltage Vref3 may have a level of $1/14*VDDQ$.

By combining the results of the three comparison operations as described above, the level of the test result Res_T may be determined. As an example, in FIG. 15C, an example is illustrated in which a logic state of 3 bits of the test result Res_T is determined based on a combination of logic states that has been determined by using the first through third reference voltages Vref1 through Vref3 illustrated in FIG. 15B. For example, when comparison results of the comparators of the first through third channels CH1 through CH3 in the first through third read operations are all logic highs H, the logic state of the test result Res_T may correspond to '111', and when the comparison results are all logic lows L, the logic state of the test result Res_T may correspond to '000'. In addition, based on a combination of other comparison results of the comparators of the first through third channels CH1 through CH3 in the first through third read operations, other logic states of the test result Res_T may be determined.

The test device may further determine whether the DUT from which the data is read (e.g., from which a PAM signal is received) passes a test based on processing the determined logic state of the test result Res_T and may generate a pass/fail signal indicating whether the DUT passes the test based on the determined logic state of the test result Res_T. For example, in response to a determination that the logic state of the test result Res_T corresponds to '000', the test device may determine that the DUT has failed the test and may generate a pass/fail signal indicating that the DUT has failed the test. In another example, in response to a determination that the logic state of the test result Res_T corresponds to '111', the test device may determine that the DUT has passed the test and may generate a pass/fail signal indicating that the DUT has passed the test. The pass/fail signal may be transmitted to a control device (e.g., control device 99_1) which may cause one or more memory devices to be selectively included or excluded (e.g., diverted, discarded, etc.) from a manufacturing process (e.g., from being included as inputs to manufacturing device 99_3).

However, example embodiments are not limited to examples illustrated in FIGS. 15A, 15B, and 15C. The first through third reference voltages Vref1 through Vref3 may be set at different levels in each read operation, and in addition, based on other combinations of the comparison results, the logic state of the test result Res_T may be determined. In addition, according to above-described example embodiments, two or more comparators may be arranged to determine at least three states in each of the first through third channels CH1 through CH3, and reference voltages (for example, a high reference voltage and a low reference voltage) for each channel may be differently set for the example embodiments of the PAM-8 method, etc.

Figure 16:
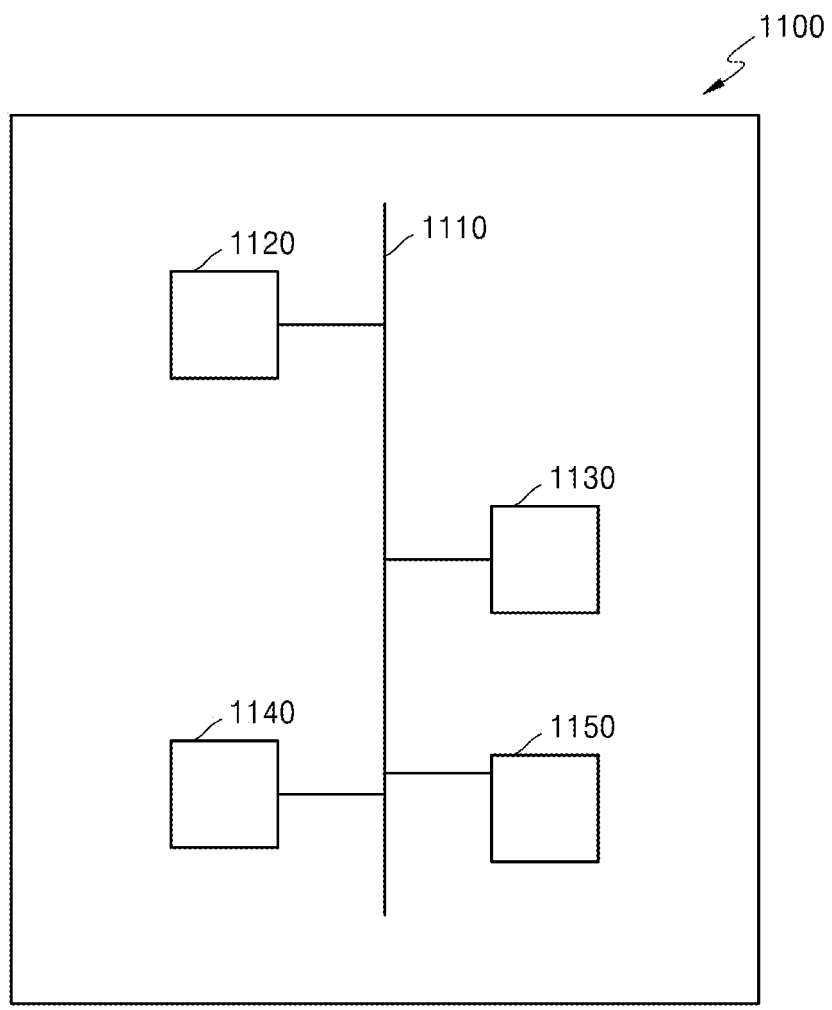
FIG. 16 is a block diagram of an electronic device according to some example embodiments.

FIG. 16 is a block diagram of an electronic device according to some example embodiments. Said electronic device may include and/or implement any of the electronic devices and/or circuits included in any of the example embodiments, including the one or more manufactured electronic devices 888 shown in FIG. 1B, the control device 99_1 shown in FIG. 1B, the manufacturing device 99_3 shown in FIG. 1B, the actuator device 99_2 shown in FIG. 1B, or the like.

Referring to FIG. 16, an electronic device 1100 may include a processor 1120, a memory 1130, and an interface 1140 that are electrically coupled together via a bus 1110. The electronic device 1100 may include one or more manipulator/actuator devices 1150 that may be coupled to the bus 1110. The interface 1140 may be a communication interface (e.g., a wired or wireless communication transceiver). The one or more manipulator/actuator devices 1150 may include an actuator of the actuator device 99_2 and/or manufacturing device 99_3 that is configured to selectively include or exclude one or more memory devices as inputs to the manufacturing of one or more electronic devices 888. The one or more manipulator/actuator devices 1150 may include manufacturing devices configured to manufacture one or more electronic devices 888.

The memory 1130, which may be a non-transitory computer readable medium, may store a program of instructions and/or other information. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, where the electronic devices 1100 is included in and/or implements the control device 99_1, the processor 1120 may be configured to process pass/fail signals received from the test system 10 to selectively include or exclude one or more memory devices as inputs the manufacturing device 99_3. The processor 1120 may be configured to generate an output (e.g., a command to control actuator device 99_2 and/or manufacturing device 99_3) based on such processing.

The processor 1120 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1120 may be configured to generate an output (e.g., an image to be displayed on a display interface) based on such processing.

One or more of the processor 1120, memory 1130, interface 1140, and/or manipulator/actuator device(s) 1150 may be included in, include, and/or implement one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory devices, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the processor 1120, memory 1130, interface 1140, manipulator/actuator device(s) 1150, or the like according to any of the example embodiments as described herein.

In some example embodiments, some or all of the systems, devices and/or elements thereof as described herein with reference to any of the drawings (including without limitation any portion of the test systems, test devices, test boards, devices under test, memory devices, electronic devices, or the like according to any of the example embodiments) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the systems, devices, and/or elements thereof as described herein, including without limitation the functionality of any portion of the test systems, test devices, test boards, devices under test, memory devices, electronic devices, or the like according to any of the example embodiments. It will be further understood that the processing circuitry may be configured to perform any of the methods as described herein, for example based on including include a non-transitory computer readable storage device, for example a solid state drive (SSD), storing a program of instructions, and a processor (e.g., CPU) configured to execute the program of instructions to implement any or all of the operations of any of the methods according to any of the example embodiments, including without limitation any or all of the operations of any or all of the methods shown in FIGS. 6-7.

While the inventive concepts have been particularly shown and described with reference to some example embodiments thereof, it will be understood that various changes in form and details may be made therein without departing from the spirit and scope of the following claims.

What is claimed is:

1. A test device configured to test a device under test (DUT) performing an interface of a pulse amplitude modulation (PAM) operation, the test device comprising:
   a logic generation/determination device configured to generate multiple bits corresponding to a test pattern;
   a first driver configured to generate a first non return to zero (NRZ) signal according to a logic state of a first bit among the multiple bits and output the generated first NRZ signal via a first channel; and
   a second driver configured to generate a second NRZ signal according to a logic state of a second bit among the multiple bits and output the generated second NRZ signal via a second channel,
   wherein the first NRZ signal has a first high level or a first low level according to the logic state of the first bit, and the second NRZ signal has a second high level or a second low level according to the logic state of the second bit,
   wherein the first high level is different from the second high level, and
   wherein the first NRZ signal and the second NRZ signal are voltage-superposed via a superposition line formed on a test board, and provided as a test signal to the DUT, and the test signal has a voltage level satisfying a PAM-4 operation.

2. The test device of claim 1, wherein the first low level is different from the second low level.

3. The test device of claim 1, wherein
   the test signal has any one level of a power voltage (VDDQ), $\frac{2}{3}$*VDDQ, $\frac{1}{3}$*VDDQ, or 0 V based on the PAM-4 operation, and
   a sum of the first high level and the second high level is 2*VDDQ.

4. The test device of claim 1, further comprising:
   a first comparator configured to receive a PAM signal that includes information of at least 2 bits from the DUT via the first channel, and compare the PAM signal to a first reference voltage; and
   a second comparator configured to receive the PAM signal via the second channel in parallel with the first comparator, and compare the PAM signal to a second reference voltage,
   wherein, as a first read operation and a second read operation are performed on an identical piece of data from the DUT, a test result is continuously provided to the first comparator and the second comparator, and
   in the first and second read operations, a level of at least one of the first reference voltage or the second reference voltage is changed.

5. The test device of claim 4, wherein,
   in one of the first read operation or the second read operation, a level of the first reference voltage and a level of the second reference voltage are set to be identical, and
   in another of the first read operation or the second read operation, the level of the first reference voltage is set to be different from the level of the second reference voltage.

6. The test device of claim 5, wherein the logic generation/determination device is configured to determine a logic state of the test result based on
   combining comparison results of the first and second comparators in the first read operation, and
   combining comparison results of the first and second comparators in the second read operation.

7. The test device of claim 1, further comprising:
   a first comparator and a second comparator configured to receive, in parallel, a PAM signal that includes information of at least 2 bits from the DUT via the first channel as a test result; and
   a third comparator and a fourth comparator configured to receive, in parallel, the PAM signal via the second channel,
   wherein the first comparator is configured to compare the PAM signal to a first high reference voltage, the second comparator is configured to compare the PAM signal to a first low reference voltage, the third comparator is configured to compare the PAM signal to a second high reference voltage, and the fourth comparator is configured to compare the PAM signal to a second low reference voltage, wherein a level of the first high reference voltage is different from a level of the second high reference voltage.

8. A test system, comprising:

a test board configured to communicate with a test device, the test device including a non return to zero (NRZ) interface circuit, wherein the test board is configured to
- receive a first NRZ signal having a voltage level according to a logic state of a first bit among multiple bits from the test device via a first channel, and
- receive a second NRZ signal having a voltage level according to a logic state of a second bit among the multiple bits from the test device via a second channel, wherein the test board includes a superposition line configured to provide a pulse amplitude modulation (PAM) signal, which is generated to satisfy a PAM operation based on voltage-superposing the first NRZ signal and the second NRZ signal, as a test signal to a device under test (DUT).

9. The test system of claim 8, wherein
the superposition line includes
- a first conductive line connected to the first channel,
- a second conductive line connected to the second channel, and
- a third conductive line electrically connected to both of the first and second conductive lines, the third conductive line configured to transmit the PAM signal, and the third conductive line is connected to the DUT via one DUT channel.

10. The test system of claim 8, wherein
the first NRZ signal has a first high level or a first low level according to the logic state of the first bit,
the second NRZ signal has a second high level or a second low level according to the logic state of the second bit, and
the first high level is different from the second high level.

11. The test system of claim 10, wherein the first low level is different from the second low level.

12. The test system of claim 10, wherein
the test signal has any one level of a power voltage (VDDQ), ⅔*VDDQ, ⅓*VDDQ, or 0 V based on a PAM-4 operation, and
a sum of the first high level and the second high level is 2*VDDQ.

13. The test system of claim 8, wherein
a PAM signal comprising information of at least 2 bits from the DUT is transmitted to the superposition line as a test result, and
the test result is provided in parallel to the test device via the first and second channels.

14. The test system of claim 13, wherein the test device comprises:
a first comparator configured to compare the test result received via the first channel to a first reference voltage;
a second comparator configured to compare the test result received via the second channel to a second reference voltage; and
a logic generation/determination device configured to determine a logic state of the test result based on a combination of comparison results of the first comparator and the second comparator,
wherein a level of the first reference voltage is different from a level of the second reference voltage.

15. The test system of claim 14, wherein the logic generation/determination device is configured to generate a test pattern including the multiple bits for generating the test signal.

16. An operation method of a test system configured to test a device under test (DUT) performing an interface of a pulse amplitude modulation (PAM) operation, the operation method comprising:
outputting a first non return to zero (NRZ) signal according to a logic state of a first bit among multiple bits corresponding to a test pattern via a first channel;
outputting a second NRZ signal according to a logic state of a second bit among the multiple bits via a second channel; and
providing a PAM signal generated to satisfy the PAM operation based on voltage-superposing the first NRZ signal and the second NRZ signal as a test signal to the DUT via a superposition line,
wherein the first NRZ signal has a first high level or a first low level according to the logic state of the first bit, and the second NRZ signal has a second high level or a second low level according to the logic state of the second bit,
wherein the first high level is different from the second high level.

17. The operation method of claim 16, further comprising:
first comparing the PAM signal comprising information of at least 2 bits received as a test result from the DUT via the first channel to a first reference voltage;
second comparing the PAM signal received via the second channel in parallel with the first channel to a second reference voltage; and
determining a logic state of the test result based on a combination of a first comparison result of the first comparing and a second comparison result of the second comparing,
wherein a level of the first reference voltage is different from a level of the second reference voltage.

18. The operation method of claim 16, further comprising:
outputting a third NRZ signal according to a logic state of a third bit among the multiple bits via a third channel,
wherein the third NRZ signal has a third high level or a third low level according to the logic state of the third bit, and
wherein, as the first through third NRZ signals are voltage-superposed, the test signal has any one of N voltage levels, wherein N is an integer equal to or greater than 5.

19. The operation method of claim 17, further comprising:
manufacturing one or more electronic devices such that one or more particular memory devices associated with the DUT are selectively included in or excluded from the one or more manufactured electronic devices, based on the determined logic state of the test result.

* * * * *